(12) United States Patent (10) Patent No.: US 7,489,133 B1
Keidl et al. (45) Date of Patent: Feb. 10, 2009

(54) TRAY FOR POSITIONING AN OBJECT WITHIN AN IMAGING COIL

(75) Inventors: Helmut Keidl, Hartland, WI (US); Christopher D. Keidl, Hartland, WI (US)

(73) Assignee: Midwest Composite Technologies, Inc., Hartland, WI (US)

( * ) Notice: Subject to any disclaimer, the term of this patent is extended or adjusted under 35 U.S.C. 154(b) by 3 days.

(21) Appl. No.: 11/680,551

(22) Filed: Feb. 28, 2007

(51) Int. Cl.
 *G01V 3/00* (2006.01)
(52) U.S. Cl. ..................... 324/318; 600/421
(58) Field of Classification Search ............ 324/318, 324/322; 600/421, 422
See application file for complete search history.

(56) References Cited

U.S. PATENT DOCUMENTS

| | | | | |
|---|---|---|---|---|
| 5,085,219 | A * | 2/1992 | Ortendahl et al. | 600/422 |
| 5,221,902 | A * | 6/1993 | Jones et al. | 600/422 |
| 5,274,332 | A * | 12/1993 | Jaskolski et al. | 324/318 |
| 5,388,580 | A * | 2/1995 | Sullivan et al. | 600/421 |
| 6,433,548 | B1 * | 8/2002 | Furuta et al. | 324/318 |

OTHER PUBLICATIONS

Midwest RF, LLC., "Engineered Excellence in MRI Coil Technology," Brochure, Date: 2002.
Midwest RF, LLC., "Specialty MRI Coils," <http://www.midwestrf.com>, Date: 2005.
Midwest RF, LLC., "Radiation Oncology MRI Head Array Coil," <http://www.midwestrf.com>, Date: 2005.
Magnemedix, Inc., "MRI Coils—Special Procedures and Accessories," <http://www.magnemedix.com/products/procedures/speciality_coils.html>, Date: Copyright 2001-2006.
Virtual Science Fair, "Gamma Knife Neurosurgery Without Incision," <http://www.virtualsciencefair.org/2006/cham6m2/how.html>, Date: 2006.
Lindquist, "Explaining Treatment Options in Acoustic Neuroma," British Acoustic Neuroma Association, <http://www.bana-uk.com/treatment/cromwell.asp>, Date: 2005.
General Electric Company, "Magnetic Resonance Imaging," <http://www.gehealthcare.com/euen/mri/products/signa-hde-15t/index.html>, Date: 2007.
Elekta AB, <http://www.ensproducts.elekta.com> Date: 2005.
Civco Medical Solutions, <www.medtec.com> Date: 2005.

* cited by examiner

*Primary Examiner*—Louis M Arana
(74) *Attorney, Agent, or Firm*—Jansson, Shupe & Munger Ltd.

(57) ABSTRACT

Trays for positioning of an object within an imaging coil for imaging procedures. Tray embodiments include a body having sides, ends, an object-supporting wall between the sides and at least one protrusion extending laterally outward from each side of the body. The protrusions cooperate with the structure of the particular imaging coil to locate the tray at a proper imaging position within the imaging coil. Patient-immobilization devices and object-holding devices may be associated with the trays. The trays enable off-the-shelf imaging coils to be adapted for use with an expanded number of patient-immobilization devices and object-holding devices.

20 Claims, 20 Drawing Sheets

TRAY FOR POSITIONING AN OBJECT WITHIN AN IMAGING COIL

FIELD

The field relates to portable supports and carriers, and, more specifically, to carriers and supports for use in temporarily securing objects within an imaging coil.

BACKGROUND

Various imaging procedures are available to generate multiple two-dimensional cross-sectional images of tissue and three-dimensional reconstruct-ions. These images are used for many purposes, including for diagnosis of illness, planning of medical procedures and for research and investigation generally. Magnetic Resonance Imaging (MRI) is one such imaging procedure.

In order to enhance the quality of the MRI images, the object to be imaged, for example part of a patient's body, is placed within a structure known in the industry as an "imaging coil." Imaging coils useful in MRI are available from commercial sources such as General Electric® and Siemens® Medical Solutions USA. The imaging coil is a one or two-piece assembly that encloses an antenna array, or coil, which speeds MRI imaging and enhances MRI image clarity. The imaging coil is positioned closely around the object to be imaged. The imaging coil and object to be imaged are then positioned inside the "tunnel" portion of an MRI machine for generation of the MRI images.

For at least MRI imaging purposes, it is important that the object to be imaged is properly positioned within the imaging coil. A proper position is a position within the imaging coil in which the object to be imaged is fully surrounded by the antenna enclosed within the imaging coil. Consistent, proper positioning of the object to be imaged facilitates locating of the tissue or thing which is of interest, thereby contributing to more efficacious treatments and therapies.

And, as can be appreciated, the object to be imaged should not move during the imaging process. Limitation of movement is required to generate clear, accurate images. In healthcare applications, patient movement is a frequent problem that results in corrupt images and extended imaging procedure times. Such complications diminish the quality of patient care and increase cost.

In the health-care context, a number of devices are presently used with imaging coils to both position the patient within the imaging coil and limit patient movement. Representative devices are sterotactic frames and thermoplastic immobilization masks. A stereotactic frame is a type of head enclosure which is secured directly to the patient's head and which prevents head movement. A thermoplastic mask is further type of head enclosure in which a shrink fit between the mask and the patient's head limits head movement. Fiducial markers visible in the generated MRI image are typically attached to both types patient-immobilization devices to facilitate location of the tissue of interest. With both types of devices, the device and patient's head are placed within the imaging coil in order to perform the imaging procedure.

Even with the use of patient-immobilization devices such as those described, problems remain with respect to positioning of the patient within the imaging coil and limiting patient movement. One problem is that the patient-immobilization device typically has a shape, size and configuration which is not complementary to that of the imaging coil. For instance, a patient-immobilization device from one source may not be compatible with an imaging coil from another source. In order to provide the desired compatibility, it would be necessary to modify the "off-the-shelf" imaging coil supplied by the manufacturer in some way. Such imaging coil modification is costly and may be ineffective. As a result of such incompatibility, it may be difficult to consistently position the patient-immobilization device at the desired proper position within the imaging coil. And, the patient-immobilization device may move within the imaging coil, potentially corrupting the image, should the patient shift position during the imaging process.

Furthermore, it is a challenge to fit a patient-immobilization device of the type previously described to the patient and to transport and position the patient in the imaging coil while fitted with the patient-immobilization device. It is highly desirable to avoid contact between the patient immobilization device and the imaging coil during patient positioning so as to avoid unnecessary patient discomfort. Even if a patient-immobilization device were not used, the nature of the patient's condition (e.g. head or neck injury) may make it difficult to position the patient within the imaging coil. The capability to perform as much preparatory positioning of the patient at a position outside the imaging coil followed by ease of patient movement to the proper position within the coil is desirable.

One solution to some of the foregoing problems is provided by the Special Procedures Headcoil system sold by Midwest RF, LLC of Hartland, Wis., a related company of the applicant. The Special Procedures Headcoil is an imaging coil which is specially-manufactured to receive an insert to which a stereotactic frame or thermoplastic immobilization mask as described above is attached. The Special Procedures Headcoil is manufactured with a specially-formed pocket corresponding to the shape of the insert which receives the insert so that the insert and stereotactic frame or thermoplastic immobilization mask are temporarily held in place.

The Special Procedures Headcoil system is highly effective for its intended purpose. However, the insert for supporting the stereotactic frame or thermoplastic immobilization mask has a headcoil-specific shape which is not compatible with off-the-shelf imaging coils from manufacturers other than Midwest RF and, therefore, cannot be used to secure a patient's head or other object at a desired position within such other imaging coils. And, it is difficult for the medical professional to see the position of the insert because the insert is completely enclosed by the Special Procedures Headcoil. Finally, the insert does not include easily accessible gripping surfaces to facilitate lifting of the insert from the headcoil by the medical professional who is assisting the patient with the imaging procedure.

It would be an improvement in the art to provide apparatus which would improve patient care, which would make it easier to position a patient in an imaging coil, which would facilitate generation of better images and which would be capable of use with a broad range of unmodified, off-the-shelf MRI imaging coils and other imaging coil types.

SUMMARY

Trays for temporarily positioning an object within an imaging coil are shown and described herein. Such trays provide a movable platform useful to transport and locate a patient or other object at the proper position within the imaging coil. Tray embodiments are useful to facilitate limitation of movement during imaging. The trays may be used to adapt off-the-shelf imaging coils for use with patient-immobilization and object-holding devices with which the imaging coil would otherwise be incompatible absent modification. The trays contribute to generation of more accurate images, reduce the amount of time needed to generate the images and, in the health-care context, generally improve the quality of patient care.

The tray embodiments are discussed herein in conjunction with MRI-type imaging coils. It is to be understood, however, that the trays may be used with other types of imaging coils, including coils based on technology which has not yet been developed.

Preferred tray embodiments suitable for use in temporary positioning of an object within an imaging coil include a body having sides, ends, an object-supporting wall between the sides and at least one protrusion extending laterally outward from each side of the body. Each preferred protrusion has ends, a distal edge and a bottom. Any number of protrusions may be utilized. Preferred forms of the object-supporting wall can support a patient-immobilization device or other object-holding device secured thereto.

It is preferred that the tray embodiments are configured to fit within an imaging coil lower housing between lower housing sidewalls and across a lower housing surface between the sidewalls. In preferred embodiments, the tray is properly positioned within the imaging coil by positioning of the protrusions ends between opposed surfaces on the imaging coil and by contact between at least a portion of the protrusion bottoms and a corresponding upper surface along a respective lower housing sidewall. This arrangement also constrains movement of the properly located tray so that the tray remains in the proper position.

It is preferred that the tray is a one-piece, or unitary, part made of plastic or non-magnetic metals. Preferably, the protrusions may be visible outside the imaging coil thereby facilitating tray positioning with respect to the imaging coil. It is also preferred that the protrusions may be gripped making it easier for the medical professional or other user to grasp and move the trays.

Preferred tray embodiments are capable of being manufactured for use with different brands of off-the-shelf commercially-available imaging coils which have different shapes and which are not custom-manufactured for use with a particular type of patient-immobilization or object-holding device. Trays may be used with one-piece imaging coils. And, preferred forms of the trays are capable of serving as a platform for use with different types of patient-immobilization or object-holding devices. These types of patient-immobilization or object-holding devices have shapes and configurations which would typically be incompatible with the imaging coil were it not for their association with the improved tray. Therefore, the preferred trays provide the opportunity to expand the range of procedures and uses capable of being performed with an off-the-shelf, non-customized imaging coil, thereby reducing costs and improving patient care.

Preferred forms of the trays further contribute to improved patient care because the patient and tray can be pre-positioned outside of the imaging coil at a position with more freedom of movement for both the patient and medical professional or other user. After the patient is pre-positioned, the tray can be used to support the patient for proper positioning within the imaging coil.

Other features and advantages are described in connection with the detailed description which follows.

BRIEF DESCRIPTION OF THE DRAWINGS

Exemplary imaging coil trays may be understood by reference to the following description taken in conjunction with the accompanying drawings, in which like reference numerals identify like elements throughout the different views. The drawings are not necessarily to scale, emphasis instead being placed upon illustrating the principles of the invention. In the accompanying drawings.

Figure 1:
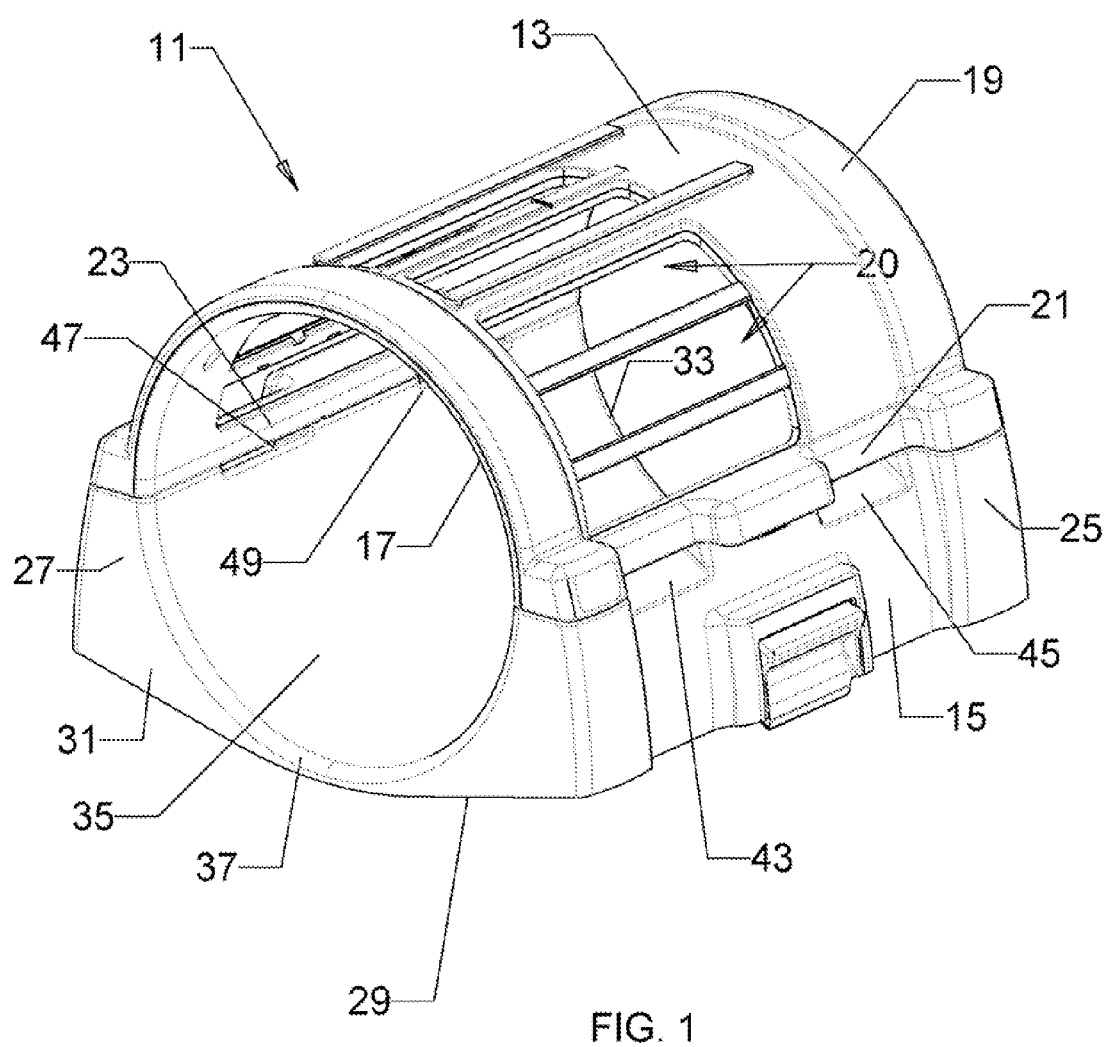
FIG. 1 is a perspective view of an exemplary imaging coil useful for MRI imaging procedures.
Figure 2:
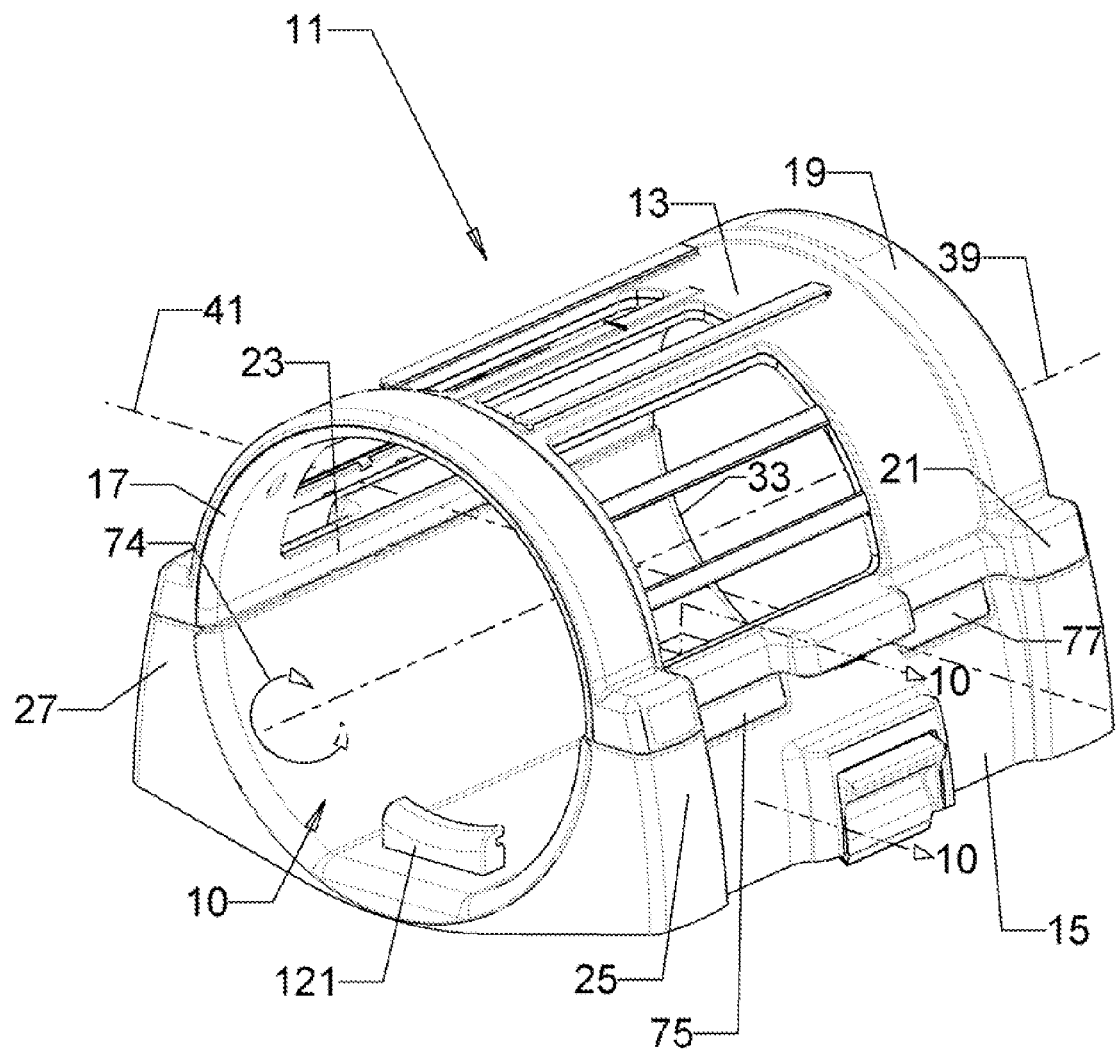
FIG. 2 is a perspective view of the imaging coil of FIG. 1 in combination with an exemplary tray embodiment.

While the trays are susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Referring now to the figures, there are shown two exemplary embodiments of a tray 10, 1010 suitable for use in positioning an object within an exemplary imaging coil 11, 1011. For convenience and brevity, trays 10, 1010 and coils 11, 1011 will be discussed together notwithstanding the differences in structure. Imaging coils 11, 1011 are off-the-shelf, unmodified coils useful for MRI imaging procedures. The exemplary MRI imaging coil 11 shown in FIGS. 1-4 is a 1.5T Split Head Coil Assembly, Model 2341973, available from General Electric® of Waukesha, Wis. The exemplary MRI imaging coil 1011 shown in FIGS. 11-13 and 15 is a Siemens® System Head Coil, Model 03146037, available from Siemens Medical Solutions USA, Inc. of Malvern, Pa.

While MRI imaging coils 11, 1011 are shown, it is envisioned that trays 10, 1010 may be used with other coil types which may be available now and in the future. Furthermore, and as is apparent from the figures, different imaging coil 11, 1011 brands have shapes and configurations which differ from one another. Trays 10, 1010 are not limited to use specifically with MRI imaging coils 11, 1011 as tray embodiments may be configured for use with other imaging coil types. Trays 10, 1010 are discussed herein primarily for use in the context of healthcare-related imaging applications but can be used in other imaging applications.

Figure 3:
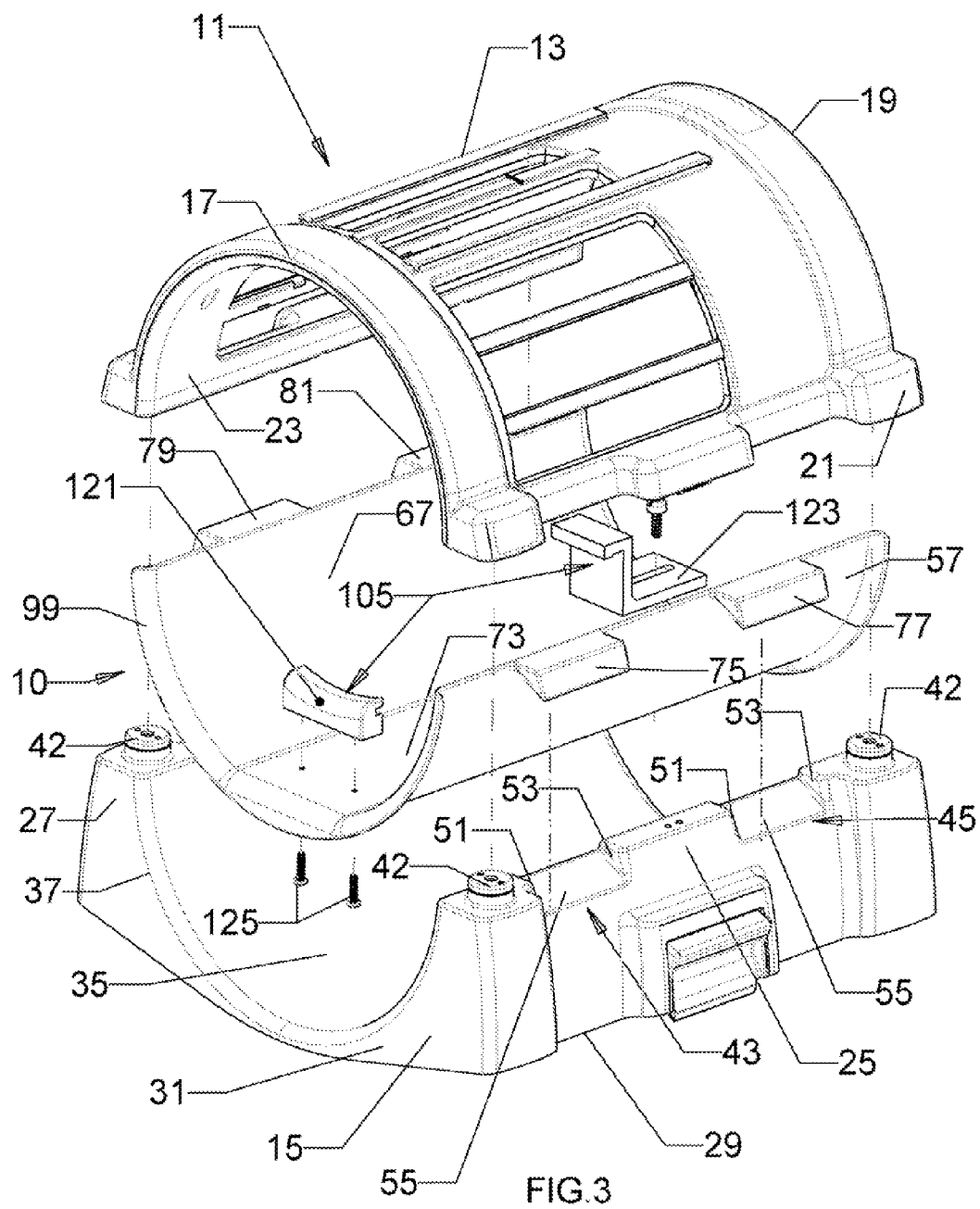
FIG. 3 is an exploded view of the imaging coil and tray embodiment of FIG. 2.
Figure 4:
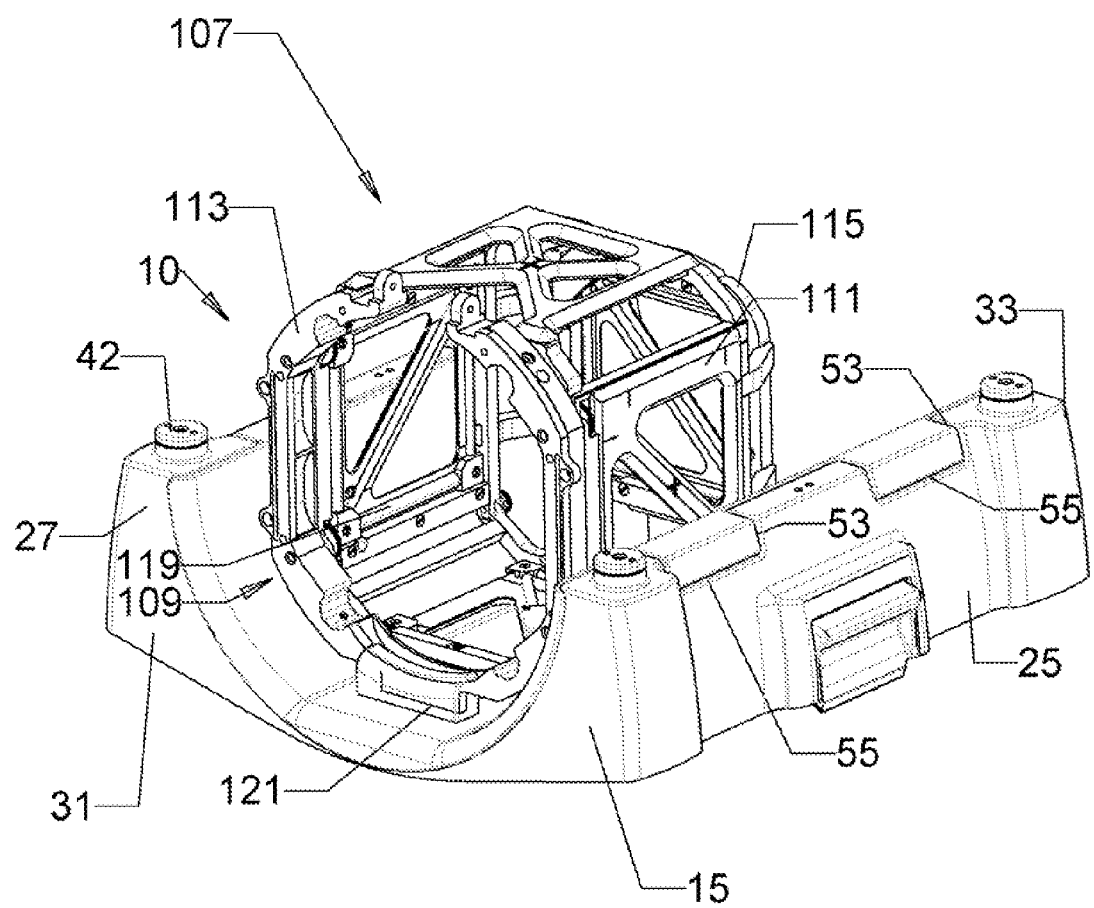
FIG. 4 is a perspective view of the imaging coil lower housing of FIGS. 1-3, the tray embodiment of FIGS. 2-3 and a stereotactic frame secured thereto.
Figure 5:
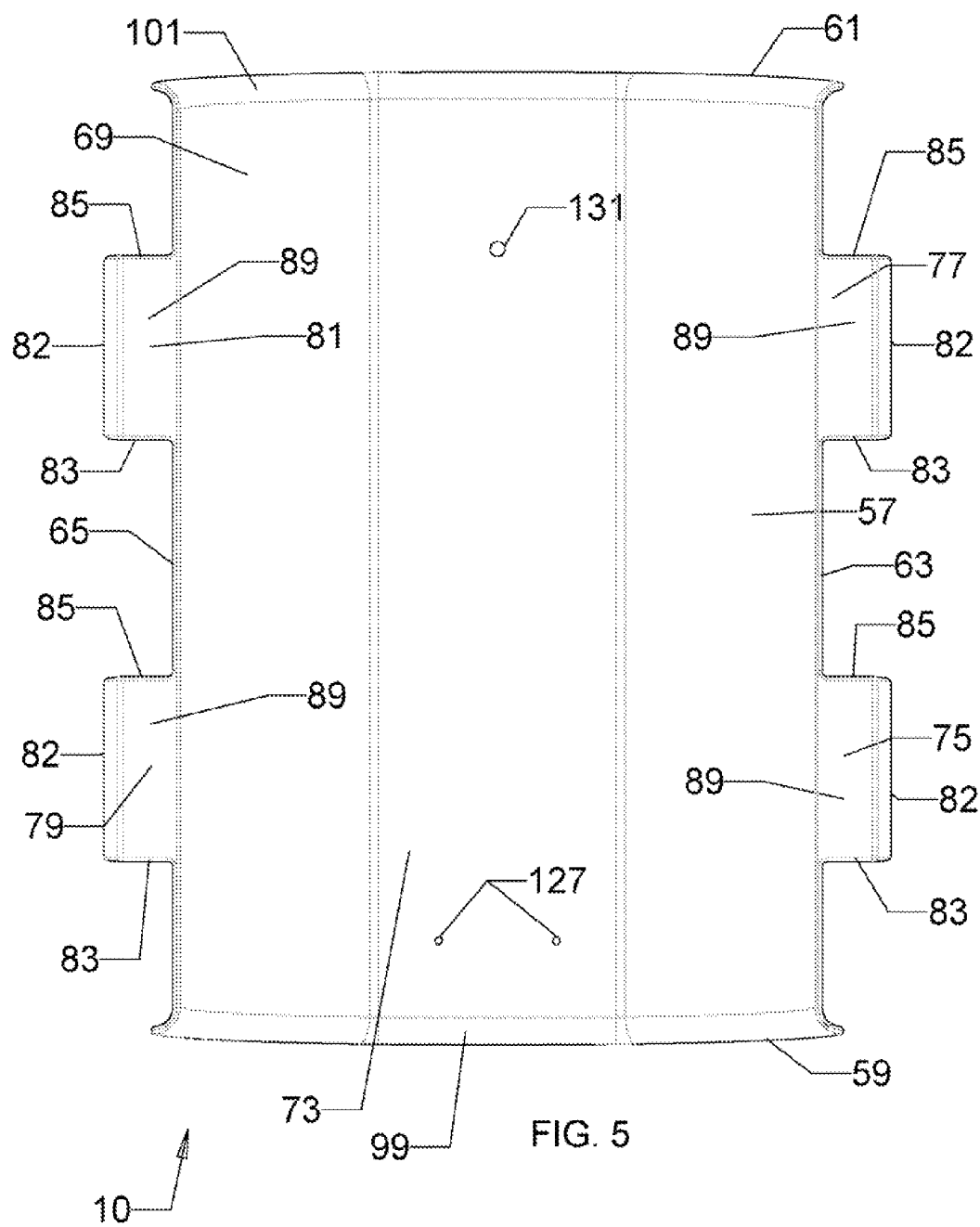
FIG. 5 is a top view of the tray embodiment of FIGS. 2-4.
Figure 6:
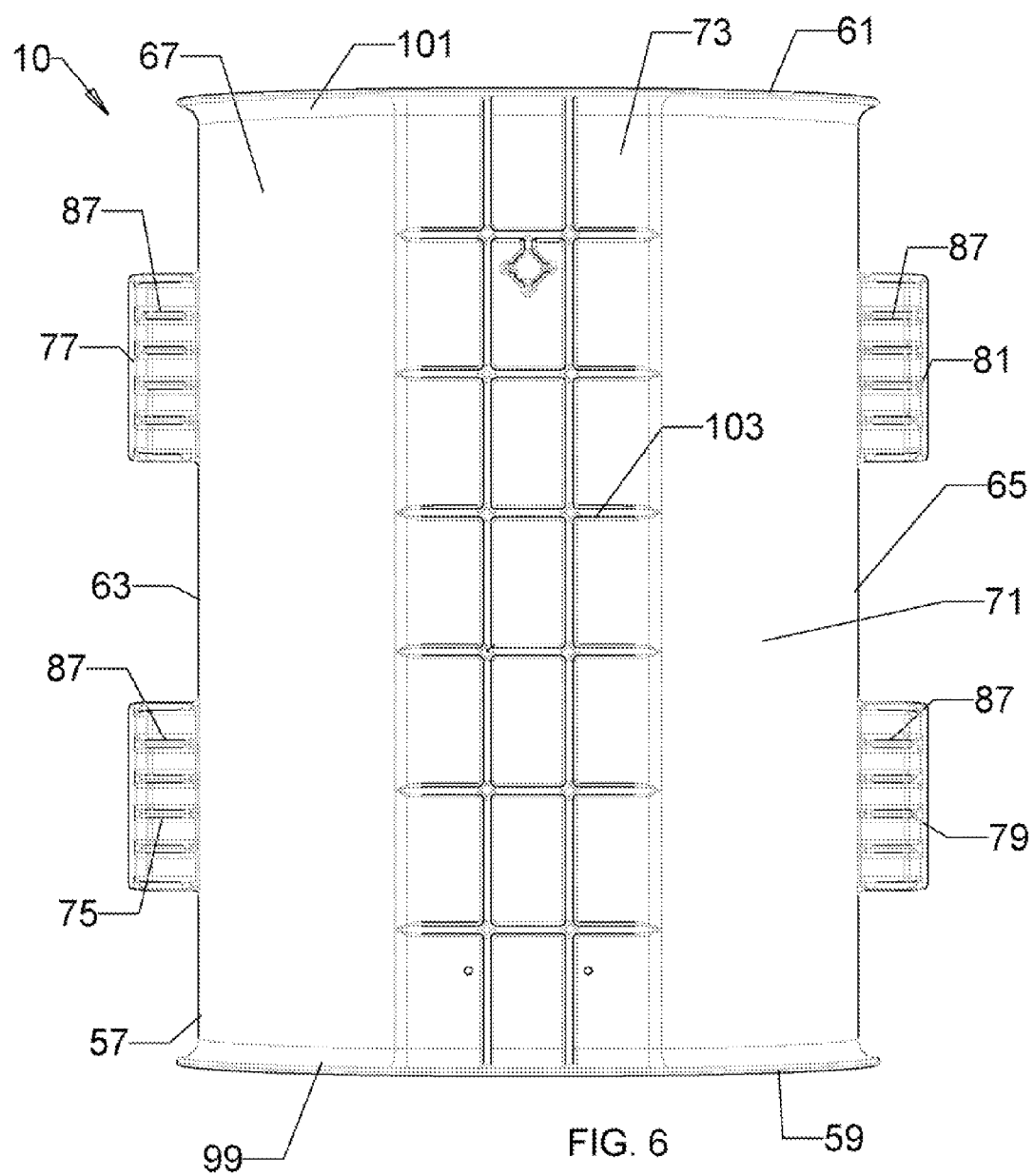
FIG. 6 is a bottom view of the tray embodiment of FIGS. 2-4.
Figure 7:
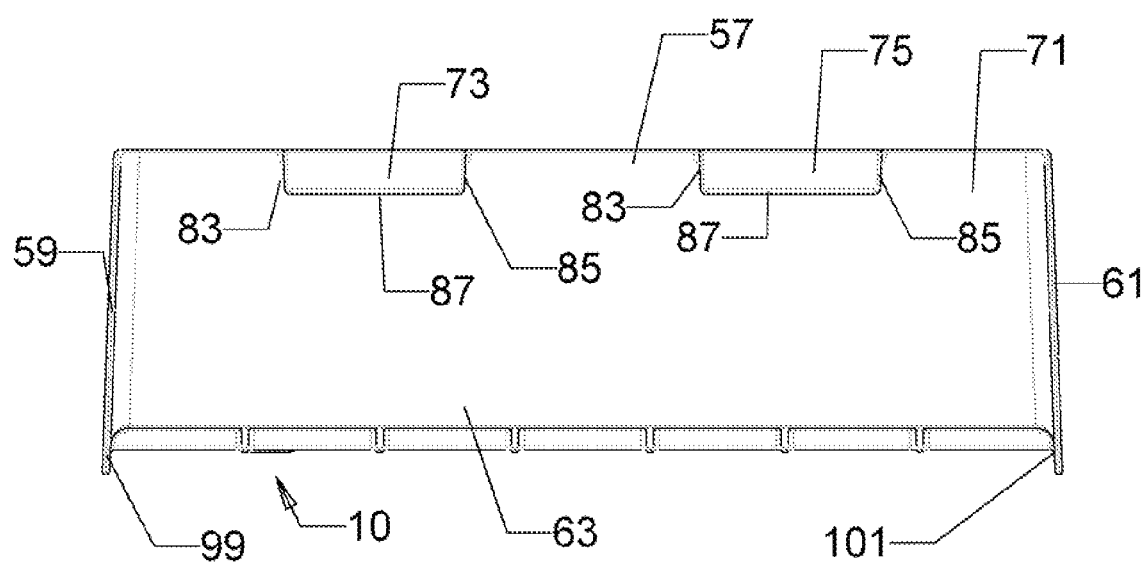
FIG. 7 is a side view of the tray embodiment of FIGS. 2-4.
Figure 11:
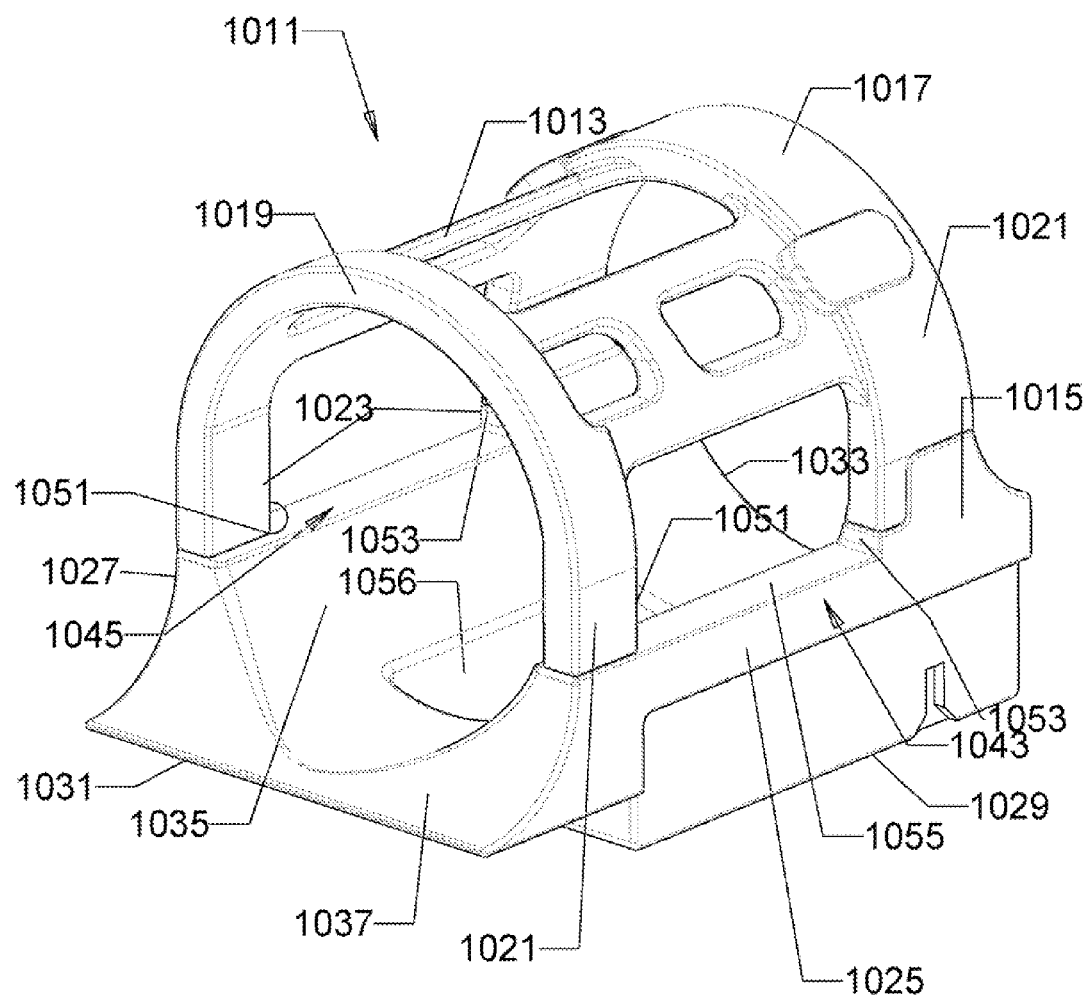
FIG. 11 is a perspective view of a further exemplary imaging coil, also useful for MRI imaging procedures.
Figure 12:
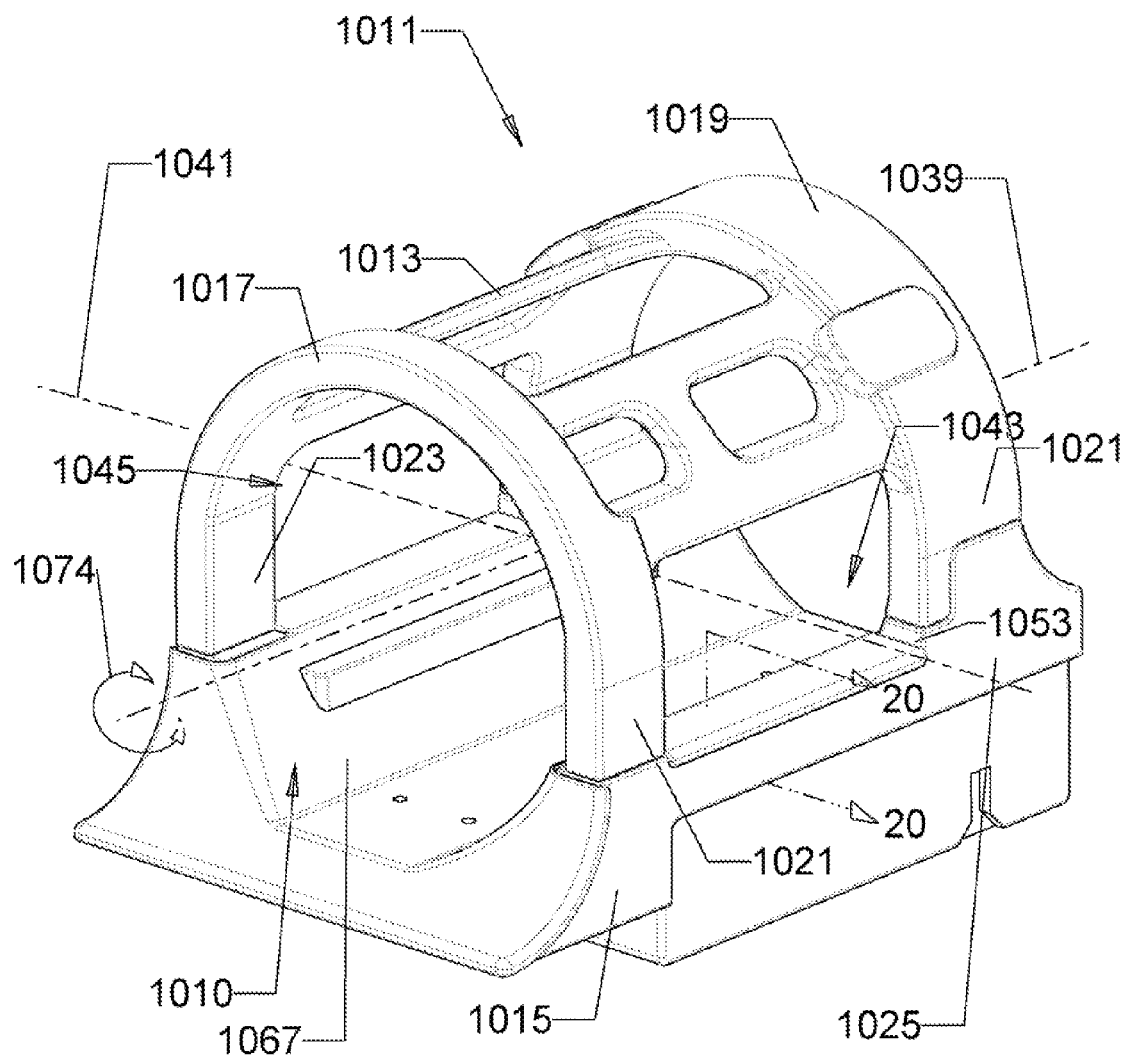
FIG. 12 is a perspective view of the imaging coil of FIG. 11 in combination with a further exemplary tray embodiment.
Figure 13:
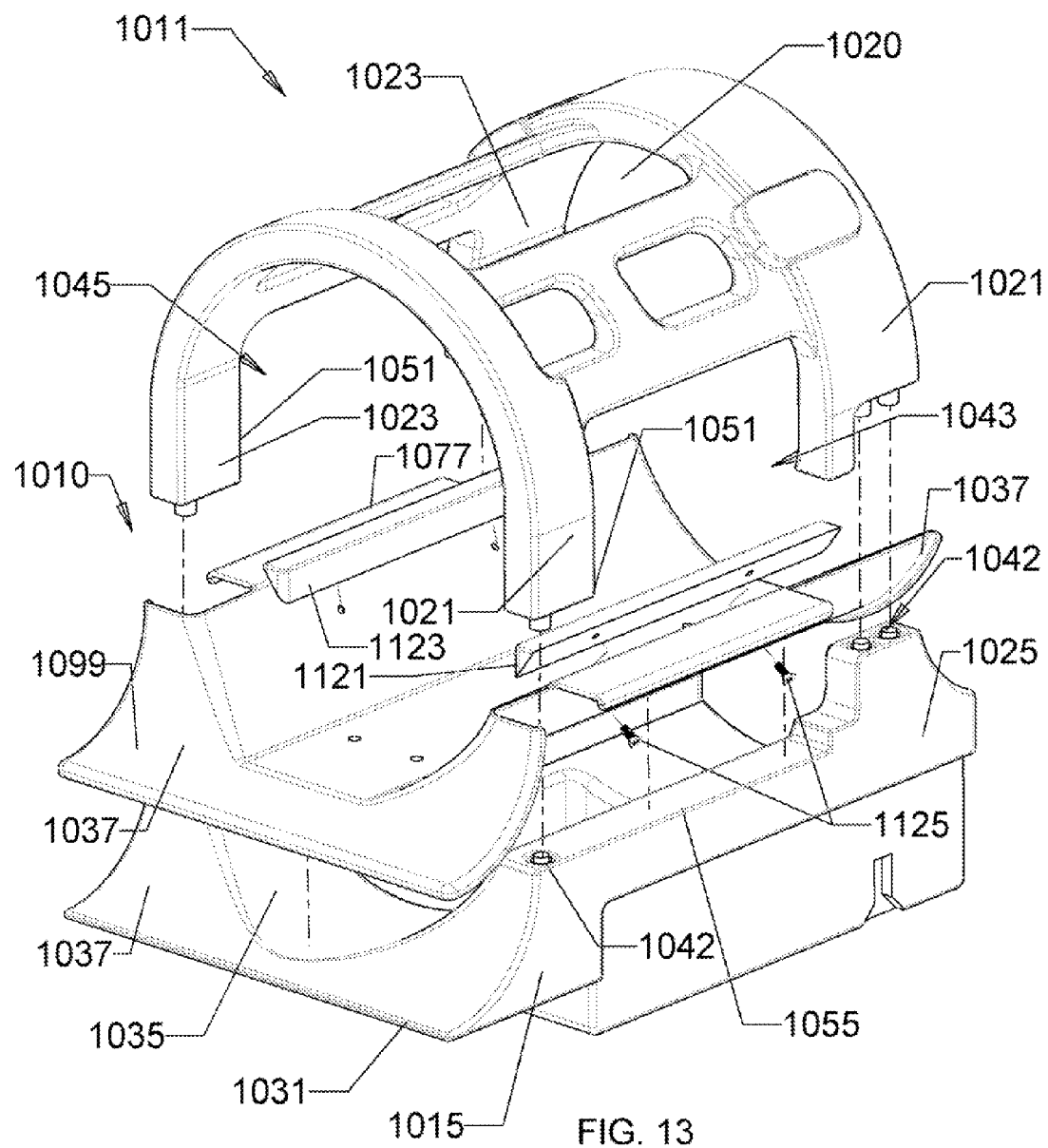
FIG. 13 is an exploded view of the imaging coil and tray embodiment of FIG. 12.

Referring then to FIGS. 1-4, 11-13 and 15, exemplary imaging coils 11, 1011 are assemblies comprising an upper housing 13, 1013 and a lower housing 15, 1015. The upper 13, 1013 and lower housings 15, 1015 may be temporarily joined together to form the imaging coil 11, 1011. As shown in FIGS. 3-4 and 13, separation of the upper housing 13, 1013 from the lower housing 15, 1015, results in the imaging coil 11, 1011 being in an "open" position in which lower housing 15, 1015 is ready to receive the patient's head for positioning prior to imaging. As shown in FIGS. 1-2 and 11-12, joining together of the upper housing 13, 1013 and the lower housing 15, 1015 results in the imaging coil 11, 1011 being in a "closed" position suitable for use in an imaging procedure. In the imaging coil embodiments 11, 1011 shown, the closed imaging coil has a somewhat cylindrical appearance, particularly suited to fit fully around a patient's head for MRI brain and head imaging. Imaging coil configurations, other than those shown, are used to image other types of patient body parts and objects. For example, imaging coils may be provided with upper and lower housings 13, 15, 1013, 1015 joined into a one-piece coil rather than the two-piece imaging coils 11, 1011 shown.

Referring further to FIGS. 1-4 and 11-13 and 15, upper housing 13, 1013 includes arch-like front 17, 1017 and rear 19, 1019 ends and downwardly-extending sidewalls 21, 1021 and 23, 1023. Openings, such as openings 20, 1020, may be provided to allow the patient to see out once the imaging coil 11, 1011 is closed around the patient's head.

Lower housing 15, 1015 includes sidewalls 25, 1025, 27, 1027 extending upwardly from housing bottom 29, 1029. Housing bottom 29, 1029 typically supports imaging coil 10, 1010 on a gurney, table or other support surface (not shown). Lower housing, 15, 1015 further includes front 31, 1031 and rear 33, 1033 ends and a lower housing surface 35, 1035 between sidewalls 25, 1025 and 27, 1027 and ends 31, 1031 and 33, 1033. For reasons of aesthetics or industrial design, a profile 37, 1037 may be provided at the transition between lower housing surface 35, 1035 and one or both ends 31, 1031 and 33, 1033. In the imaging coil embodiment of FIGS. 1-4, profile 37 at ends 31, 33 is a radius whereas in the imaging coil embodiment of FIGS. 11-13 and 15, the front end 1031 profile 1037 is an outward flare while the rear end 1033 profile 1037 is more angular (not shown).

Lower housing surface 35, 1035 extends between sidewalls 25-27 and 1025-1027. In the imaging coil embodiment 11, surface 35 has a smooth-wall, partially-cylindrical appearance. In the imaging coil embodiment 1011, surface 1035 is curved. Surfaces 35, 1035 may be described as "concave" in the sense that both are open ended with a generally U-shaped surface directed toward the open end. Concave, as used herein, includes any configuration including an open end and a generally U-shaped surface, including curved surfaces, curved surfaces in combination with flat-walled surfaces, flat-walled surfaces collectively forming a generally U-shaped surface (for example providing a ⌒-type shape with squared corners), and other configurations. Such configurations are useful to receive the object to be imaged.

Upper and lower housings 13, 1013, 15, 1015 have a longitudinal extent along imaging coil axis 39, 1039 and a lateral extent along lateral axis 41, 1041.

As shown in FIGS. 3-4, 9, 11-13 and 15, upper 13, 1013 and lower housings 15, 1015 are temporarily joined together by seating of an upper housing sidewall 21, 1021, 23, 1023 on the corresponding lower housing sidewall 25, 1025 and 27, 1027, such that posts 42, 1042 extending outward from lower housing sidewalls 25, 1025 and 27, 1027 are in a corresponding female receiver (not shown) in upper housing sidewalls 21, 1021 and 23, 1023.

Upper 13, 1013 and lower housings 15, 1015 each enclose approximately half of the antenna array, or coil, (not shown) which serves to improve MRI image clarity and accelerate image generation. Joining together of the upper 13, 1013 and lower housings 15, 1015 forms two annular antenna portions (not shown) parallel to lateral axis 41, 1041, one being proximate end 31, 33 and the other being proximate end 1031, 1033. Conductors within housings 13, 1013 and 15, 1015 (not shown) run parallel to longitudinal axis 39, 1039 and join the two annular antenna portions to complete the antenna array. Location of each post 42, 1042 in the corresponding receiver forms an electromechanical connection temporarily holding upper and lower housings 13, 1013 and 15, 1015 together and forming an electrical connection between the antenna arrays in the respective upper 13, 1013 and lower housings 15, 1015.

An object which is approximately centered within the imaging coils 11, 1011 would be fully surrounded by the antenna. The proper position for an object within the imaging coils 11, 1011, therefore, is an approximately centered position in which the object to be imaged is fully surrounded by the antenna enclosed within the imaging coil.

Imaging coils 11, 1011 are typically made of a rigid, lightweight plastic material such as Delrin, urethane or polycarbonate plastic. The exemplary imaging coils 11, 1011 shown have an approximate weight of eight to ten pounds and can be readily manipulated by a medical professional or other user.

Structure of the unmodified, off-the-shelf commercially-available imaging coils 11, 1011 is capable of being utilized to position and constrain movement of tray 10, 1010 so that each such tray, and an object supported by the tray, is temporarily positioned at the proper position for imaging within the respective imaging coil 11, 1011. In the GE brand imaging coil 11, such structure comprises recesses 43, 45, 47 and 49 provided in lower housing 15 along an upper surface portion of sidewalls 25, 27. Each recess 43-49 is defined by a pair of opposed (or facing) sidewall surfaces 51, 53 and a bottom wall 55 between sidewall surfaces 51, 53.

In the Siemens brand imaging coil 1011, such structure is provided along openings 1043, 1045 present when upper and lower housings 1013, 1015 are in the "closed" position of FIGS. 11-13. In the example, the structure comprises a pair of facing sidewalls 1051, 1053 and a wall 1055 between sidewalls 1051, 1053 partially defining a respective opening 1043, 1045. Each sidewall 1051 is provided on an inner surface of downwardly-extending upper housing sidewalls 1021, 1023 and each sidewall 1053 is provided on an upwardly-extending inner surface of lower housing sidewalls 1025, 1027. Wall 1055 is an upper surface portion of respective lower housing sidewalls 1025, 1027.

The Siemens brand imaging coil embodiment 1011 further includes a generally rectangular recessed portion 1056 in housing lower surface 1035 that can be further utilized to position tray 1011. Recessed portion 1056 is transverse to both the longitudinal and lateral axes for the purpose described below. Recessed portion 1056 may have configurations other than that shown, for example, circles, octagons, and dimples. Plural recessed portions 1056 may be provided.

Exemplary tray embodiments 10 and 1011 will now be described with reference to FIGS. 2-10 and 12-20. FIGS. 2-10 show a tray 10 embodiment configured for use with the GE brand imaging coil embodiment 11 and FIGS. 12-20 show a tray 1010 embodiment configured for use with the Siemens brand imaging coil 1011. Trays 10, 1010 are constructed so that they are capable of being easily and consistently positioned at the proper position within the respective imaging coil 11, 1011 so that the patient, patient body part or other object is surrounded by the antenna within imaging coil 11, 1011. Each tray 10, 1010 fits within its respective imaging coil 11, 1011 by means of a frictional fit and without need for separate fasteners to secure tray 10, 1010 to imaging coil 11, 1011.

Referring to FIGS. 5-8 and 10 and 14, 16-20, each tray 10, 1010 has a body 57, 1057. Body 57, 1057 has a pair of opposite ends 59, 61 and 1059, 1061 and a pair of sides 63, 65 and 1063, 1065. Body 57, 1057 has an axial extent, or length, between ends 59, 61 and 1059, 1061 and a lateral extent, or width, between sides 63, 65 and 1063, 1065. An object-supporting wall 67, 1067 is between respective sides 63, 65 and 1063, 1065. As illustrated in FIGS. 2-3 and 12-13, wall 67, 1067 is sized to fit within imaging coil lower housing 15 or 1015 between lower housing sidewalls 25, 27 or 1025, 1027 and across lower housing surface 35 or 1035 between sidewalls 25, 27 or 1025, 1027.

Figure 8:
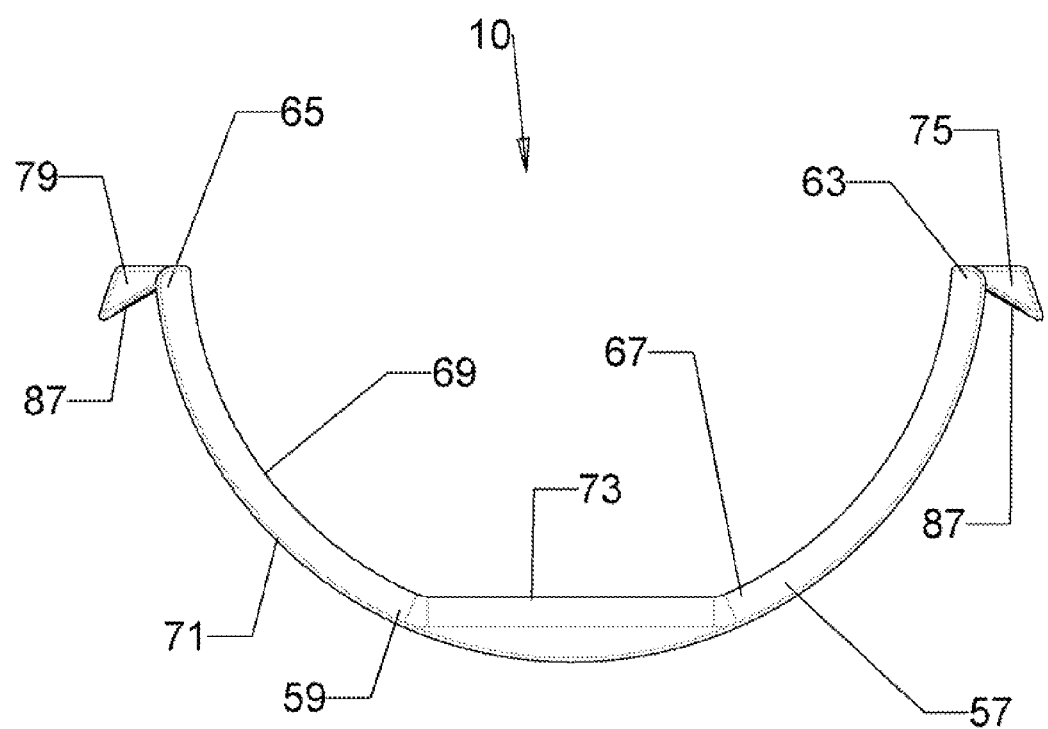
FIG. 8 is a front end view of the tray embodiment of FIGS. 2-4.
Figure 19:
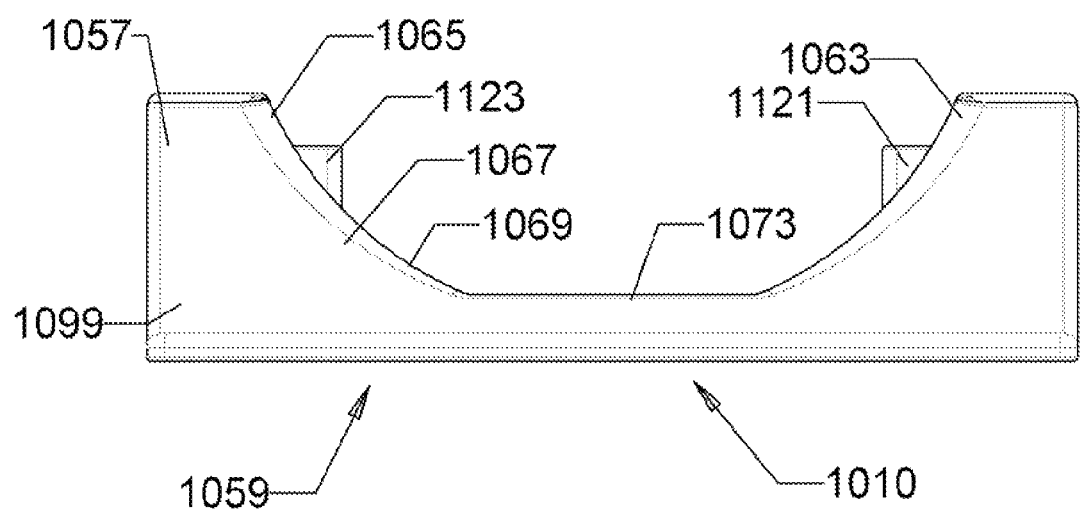
FIG. 19 is a front end view of the tray embodiment of FIGS. 12-15.

In the embodiments, each tray 10, 1010 wall 67, 1067 has an inner surface 69, 1069 and an outer surface 71, 1071. As shown in FIGS. 8 and 19, wall 67, 1067 is preferably provided with a generally concave configuration which matches that of surface 35, 1035. Inner surface 69, 1069 is generally concave as defined previously and outer surface 71, 1071 is generally convex. Convex, as used herein, includes any configuration in which the surface or boundary curves or extends outward, including curved surfaces, curved surfaces in combination with flat-walled surfaces, flat-walled surfaces collectively forming an outward-extending surface, (for example providing an inverted ⌐-type shape with squared corners), and other configurations.

In the tray embodiments 10, 1010 inner wall surface may include an intermediate portion 73, 1073 between sides 63, 65 or 1063, 1065 provided for supporting a patient-immobilization device as discussed herein.

As is apparent from a comparison of trays 10, 1010, considerable variation is permissible with respect to the configuration of walls 67, 1067 of tray body 157, 1057. As illustrated in FIGS. 2-5, and 8 wall 67 may have smooth-walled sides 63, 65 with a radius while, in other embodiments, wall 1067 has more upright sides 1063, 1065 (FIGS. 12-13 and 19). Such walls 67, 1067 preferably generally match the shape of respective lower housing surface 35, 1035 permitting the tray 10, 1010 to rest on lower housing surface 35, 1035 along at least some of wall outer surface 71, 1071 to better support and distributed the load of a patient or other object on the tray. Contact between sides 61, 63 and 1061, 1063 is useful to limit lateral movement of tray 10, 1010 along lateral axis 41, 1041. Wall 67, 1067 may be spaced from surface 35, 1035, particularly if more robust materials are used in manufacture of tray 10, 1010.

In order to properly position the patient's head, or another object, in imaging coils 11, 1011 for imaging, tray 10, 1010 should be properly positioned and generally stationary within imaging coil 11, 1011. Such proper position is a generally centered position in the coil examples 11, 1011. To temporarily maintain tray 10, 1010 at the proper position, tray 10, 1010 should preferably be constrained within imaging coil 11, 1011 against longitudinal movement along axis 39, 1039, lateral movement along axis 41, 1041 and rotational movement in either direction of dual-headed arrow 74, 1074.

Exemplary tray embodiments 10, 1010 are provided with structure which co-operates with structure of the respective imaging coil 11, 1011 to properly position tray 10, 1010 for imaging and to limit tray 10, 1010 movement from the proper position.

Referring to FIGS. 2-10, tray embodiment 10 includes four protrusions 75, 77, 79, 81 each of which extends laterally outward from a side 63, 65 of body 57. As shown in FIGS. 12-20, tray embodiment 1011 is provided with two protrusions 175, 177, each extending laterally outward from a side 1063, 1065 of tray body 1057. In the examples, protrusions 75-81 and 1075-1077 are along an upper end of sides 63, 65, 1063, 1065 and extend laterally outward from each such upper end. In these embodiments, protrusions 75-81 and 1075, 1077 fit closely within corresponding surfaces on the imaging coil 11, 1011 thereby constraining tray 10, 1010 longitudinal and rotational movement.

Figure 10:
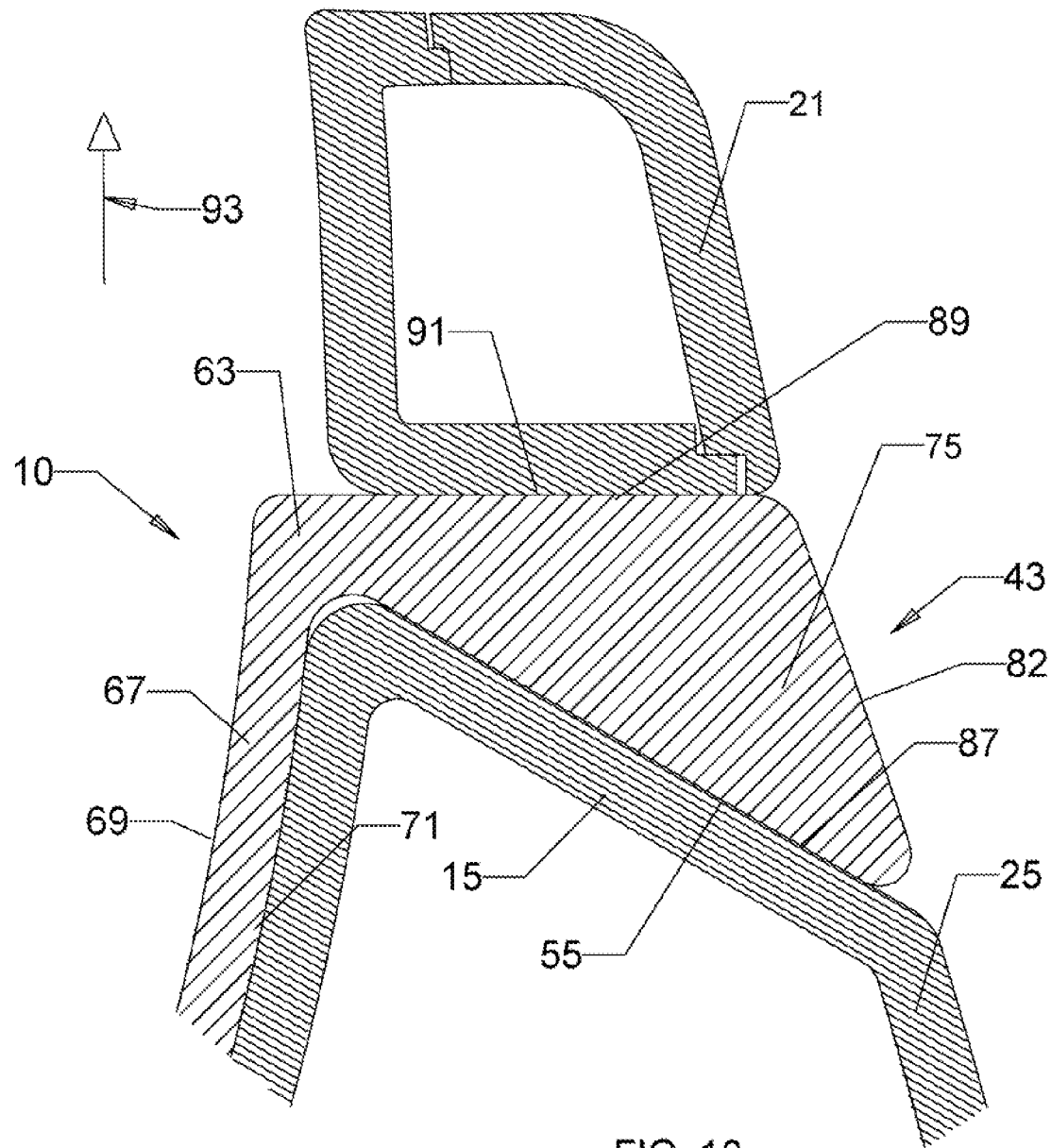
FIG. 10 is an enlarged view of the tray embodiment and imaging coil taken along section 10-10 of FIG. 2.
Figure 20:
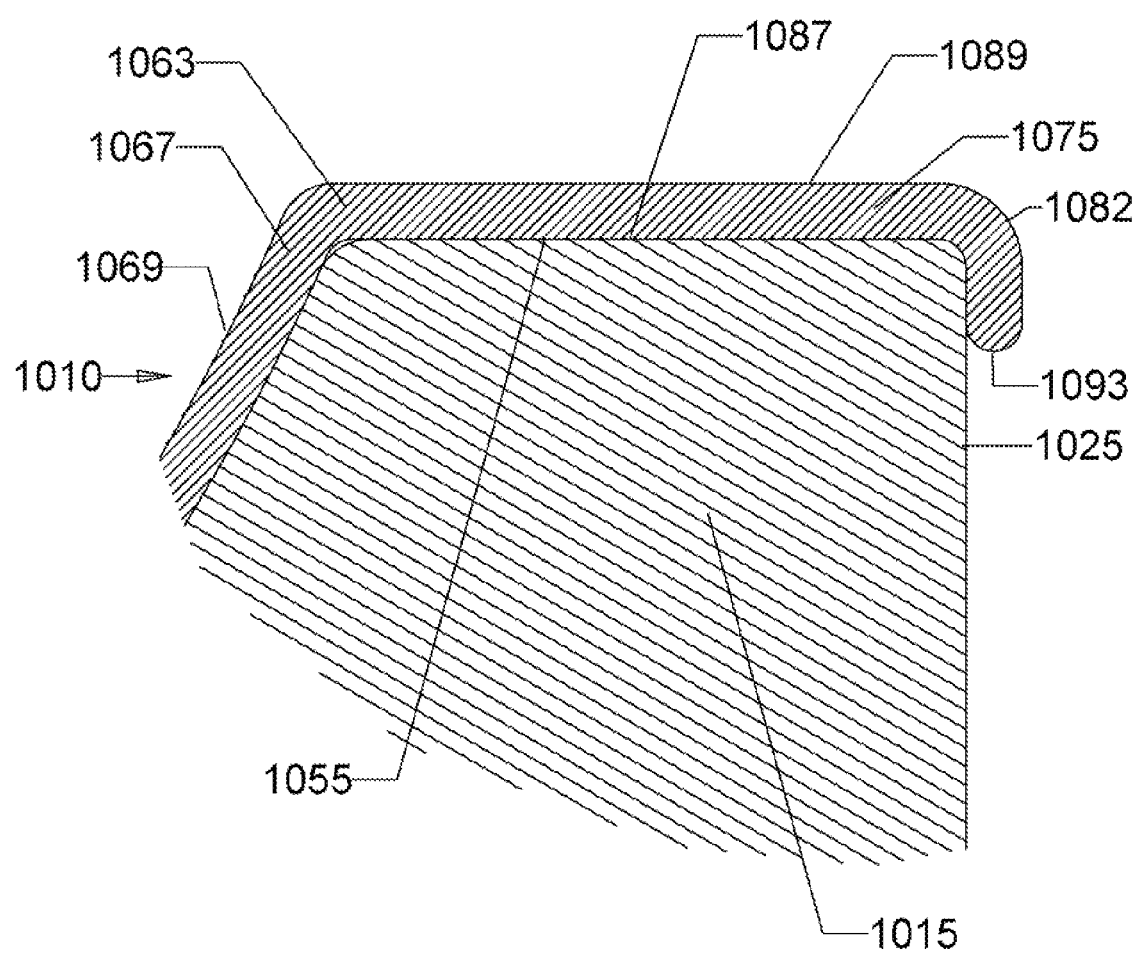
FIG. 20 is an enlarged view of the further tray embodiment and imaging coil taken along section 20-20 of FIG. 12.

In the embodiments, each protrusion 75-81 and 1075, 1077 extends outward to a distal edge 82, 1082 and has ends 83, 85, 1083, 1085 and a bottom 87, 1087. Protrusions 75-81 and 1075, 1077 are sized (i.e., have a length) such that each end 83, 85 and 1083, 1085 is closely proximate the corresponding opposed sidewall surface 51, 53 or 1051, 1053. Also in the embodiments, each protrusion bottom 87, 1087 at least partially contacts a corresponding surface 55 or 1055 along lower housing 15, 1015 sidewall 25, 27 or 1025, 1027. It is preferred that ends 83, 85, 1083, 1085 and corresponding sidewall surfaces 25, 27 or 1025, 1027 are planar. An abutting relationship between ends 83, 85 and 1083, 1085 and sidewalls 51, 53 and 1051, 1053 or a close fit between the ends 83, 85 and 1083, 1085 and sidewalls 51, 53 and 1051, 1053 (preferably leaving a gap therebetween of about 0.10 inches or less, or more preferably, a gap of about 0.03 inches or less) is preferred to limit excessive "play" or longitudinal movement of tray 10, 1010 along axis 39, 1039 of imaging coil 11, 1011. In the embodiments, bottoms 87, 1087 may rest fully or partially on the respective bottom wall 55, 1055. FIGS. 10 and 20 show an exemplary abutting relationship between planar portions of bottom 87, 1087 and a planar wall surface 55, 1055. The angular position of the planar portions of bottom 87 is useful to limit lateral movement of tray 10.

Locating of protrusions 75-81, 1075-1077 in a respective recess 43-49 or opening 1043, 1045 so that contact between ends 83, 85, 1083, 1085 and opposed walls 51, 53, 1051, 1053 properly positions the tray 10 with respect to imaging coil 11 and for tray embodiment 1011. By providing a close or abutting fit between these surfaces, tray longitudinal movement from the proper position is limited or prevented. The exemplary movement-limiting relationship between the exemplary trays 10, 1010 and the respective imaging coils 11, 1011 may be seen, for example, in FIGS. 2, 4, 9 and 12 and the sectional views of FIGS. 10 and 20.

Protrusions 75-81 and 1075, 1077 provide convenient gripping surfaces permitting a medical professional or other user to easily grasp and carry tray 10, 1010. In the embodiments of FIGS. 2-4, 10, 12-14 and 20, distal edges 82, 1082 are visible outside of the assembled imaging coil 11, 1011 making it easier for the medical professional or other user to see that the tray has been properly positioned within imaging coil 11, 1011. Protrusions 75-81 and 1075, 1077 and/or body 57, 1057 may be of a color which contrasts with the color of imaging coil 11, 1011 further facilitating tray 10, 1010 positioning.

For example, imaging coils 11, 1011 are typically made of white-colored plastic. Tray 10, 1010 may be of a darker color which contrasts with the white color of the imaging coil 11, 1011.

Protrusions 75-81 of tray embodiment 10 are further provided with a top surface 89 that can be used to further constrain movement of tray 10 with respect to imaging coil 11. Referring to FIG. 10, top surface 89 is closely proximate to, or abuts, a lower surface 91 of a respective upper housing sidewall 21 or 23. If provided, such a relationship between protrusion 75-81 and upper housing 13 limits upward movement of tray 10 with respect to imaging coil 11 in the direction of arrow 93.

Tray 10, 1010 may include other structure to facilitate locating the tray in its proper position within imaging coil 11, 1011 or to further constrain movement of tray 10, 1010. For example, and as shown best in FIG. 20, protrusion 1075, 1077 distal edges 1082 may include a downwardly-extending edge 1093. Edge 1093 abuts a lower housing sidewall 1025, 1027 and is useful to seat tray 1010 in its proper position on lower housing 1015 and to further limit lateral movement of tray 1010 along lateral axis 1041 and tray rotational movement (i.e., in either direction of arrow 1074) by providing constraint against lower housing sidewalls 1025 or 1027. Edge 1093 also provides a convenient gripping surface permitting a medical professional or other user to easily grasp and remove tray 1010 from imaging coil 1011 after the imaging procedure.

Figure 17:
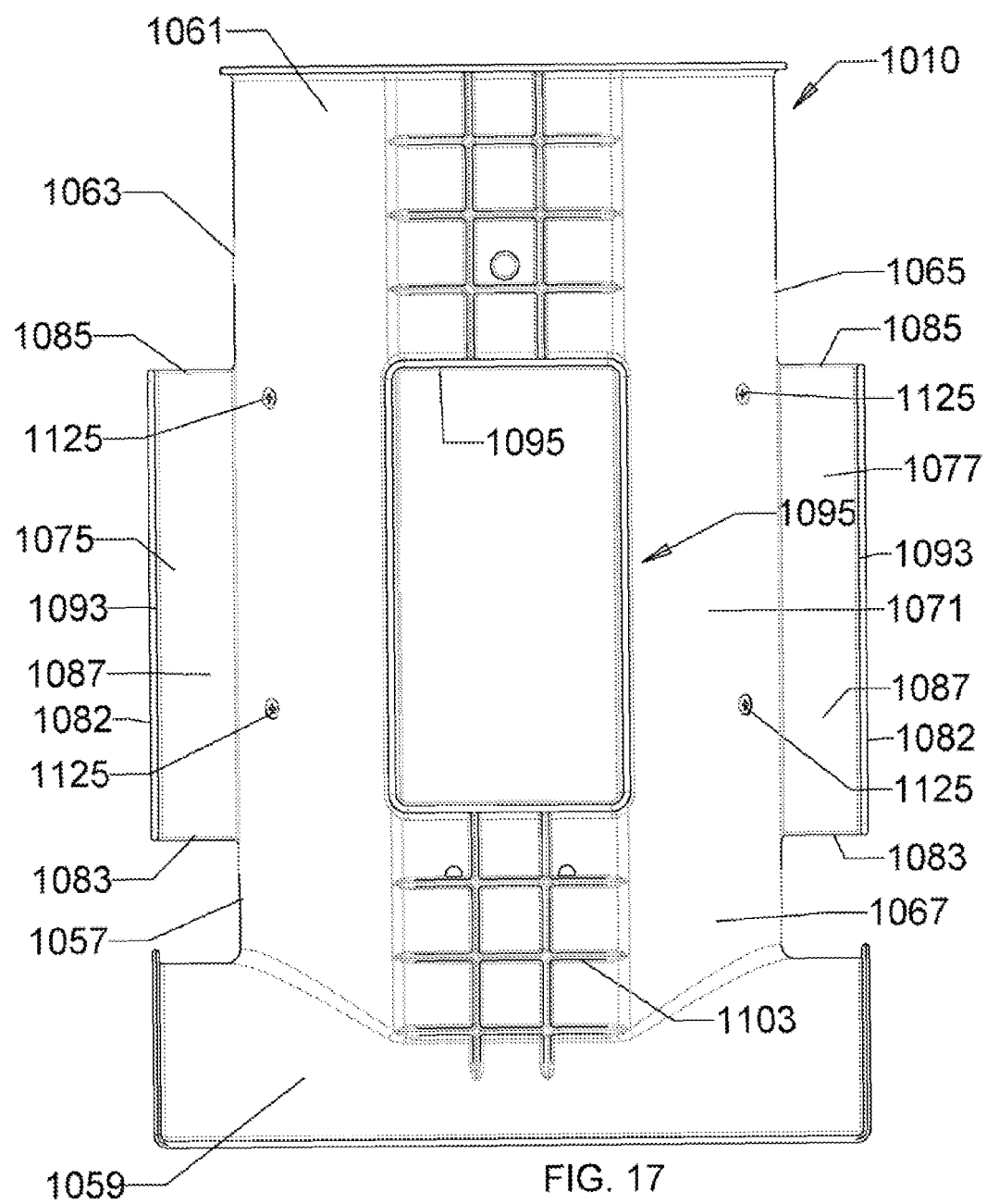
FIG. 17 is a bottom view of the tray embodiment of FIGS. 12-15.
Figure 18:
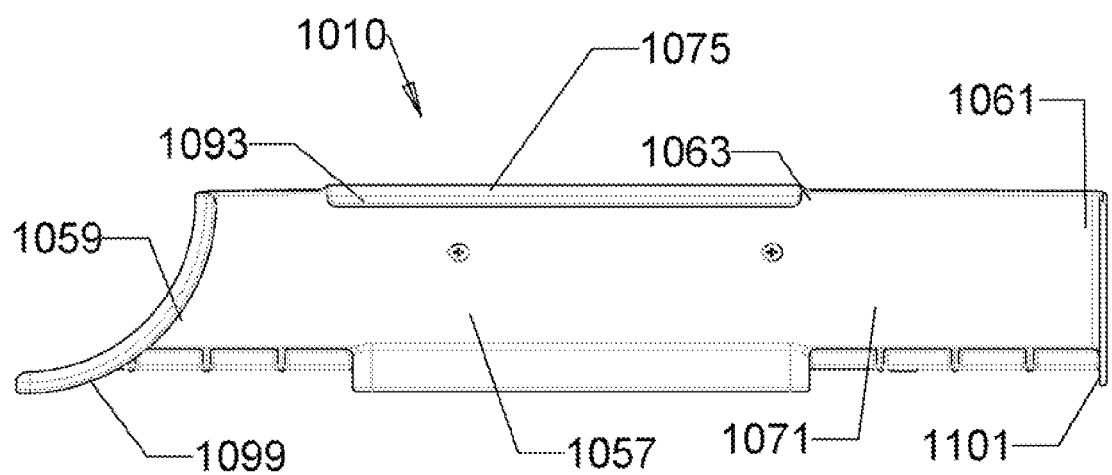
FIG. 18 is a side view of the tray embodiment of FIGS. 12-15.

Referring to FIGS. 17-18, further constraint against tray movement may be provided by a rectangular protrusion 1095 extending outward from tray outer surface 1071 keyed to mate with recessed portion 1056 in lower housing 1015. When tray 1010 is positioned on lower housing 1015, abutment of protrusion 1095 with recess 1056 limits longitudinal, lateral and rotational movement of tray 1010. Contact between protrusion 1095 and recesessed portion 1056 also facilitates locating of tray 1010 at its proper position within imaging coil 1011.

As will be appreciated by persons of skill in the art, protrusion types, other than protrusion 1095 may be employed depending on the configuration of the imaging coil. For example, protrusion 1095 could comprise any structure adapted to mate with a corresponding recessed structure on the off-the-shelf imaging coil.

Other exemplary structure provided to limit tray 10, 1010 movement with respect to imaging coil 11, 1011 may be seen in FIGS. 2-9 and 12-19. Exemplary trays 10, 1010 may optionally include one or more end protrusions 99, 101 and 1099, 1101 in or along a respective tray end 59, 61, 1059, 1061. In the embodiments, end protrusions 99, 101 and 1099, 1101 depend downward from a respective tray front and/or rear end 59, 61, 1059, 1061 and are provided with a configuration which matches or corresponds to the shape of profile 37, 1037 so that end protrusions 99, 101 and 1099, 1101 are closely proximate to, or abut, at least portions of a respective end 31, 33 or 1031, 1033 of lower housing 15, 1015. In the embodiment of FIGS. 2-9, each end protrusion 99, 101 has a configuration which is the complement of radius profile 37 provided by the manufacturer of imaging coil 11. In the embodiment of FIGS. 11-19, front end protrusion 1099 has a flared configuration which corresponds to the outwardly flared front end 1031 profile 1037 of lower housing 1015 while rear end protrusion 1101 has a more angular configuration closely matching that of lower housing rear end 133 as seen best in FIG. 18. Contact between end protrusions 99, 101 and 1099, 1101 and the respective end 31, 33 or 1031, 1033 of lower housing 15, 1015 limits longitudinal movement of tray 10, 1010 along axis 39, 1039.

As can be readily appreciated, the flared profile of front end protrusion 1099 in combination with the corresponding flared end profile 1037 along end 1031 of lower housing 1015 provide surfaces which limit any rotational movement of tray 1010 in either direction of arrow 1074. And, contact between the aforementioned end protrusions 99, 101 and 1099, 1101 and ends 31, 33 or 1031, 1033 facilitates locating of tray 10, 1010 at the proper position within imaging coil assembly 11, 1011.

Body 57, 1057 must be sufficiently robust to support the weight of the objects to be supported by the tray 10, 1010. In health-care applications, tray 10, 1010 must be able to support adult and juvenile patients, including a patient's head or other body part, without fatigue or failure. To improve body 57, 1057 rigidity, stiffening ribs 103, 1103 may be provided along the length and/or width of body 57, 157, for example in outer surface 71, 1071.

Tray may be manufactured in any suitable manner. For ease of manufacture and cost considerations, it is preferred that tray 10, 1010 is a one-piece, unitary product. In such preferred embodiments, protrusions 75-81 and 1075-1077 are integral parts of the one-piece tray. In other embodiments, tray body 57, 1057 could be mechanically joined together with protrusions 75-81 and 1075-1077, for example by adhesive or fasteners.

Tray 10, 1010 is preferably made of one or more plastic materials or non-magnetic metals. Non-magnetic metal materials include brass, bronze, titanium, aluminum and some grades of stainless steels. Plastic is a preferred material for use in manufacture of tray 10, 1010 because it is lightweight and will not interfere with MRI imaging. Representative plastic materials include one or more of polycarbonate, nylon, polyurethane, polyoxymethylene (Delrin), ultra high molecular weight polyethylene (UHMWPE), also known as high modulus polyethylene (HMPE) or high performance polyethylene (HPPE). Tray 10, 1010 may be manufactured by any suitable process such as by injection molding, computer-numerical-controlled machining (CNC) and casting processes.

Attachment apparatus 105, 1105 may be provided to facilitate securement of a patient's head or other object to tray 10, 1010. For many imaging procedures a patient-immobilization device 107, 1107 is used to hold the patient still for imaging. Tray 10, 1010 provides a means by which to properly position different types and configurations of patient-immobilization devices within a single type of off-the-shelf, commercially-available imaging coil assembly 11, 1011, thereby overcoming positioning problems based on incompatibility of an immobilization device 107, 1107 configuration with the imaging coil 10, 1010. Attachment apparatus 105, 1105 may be used to secure patient-immobilization device 107, 1107 to tray 10, 1010.

Figure 9:
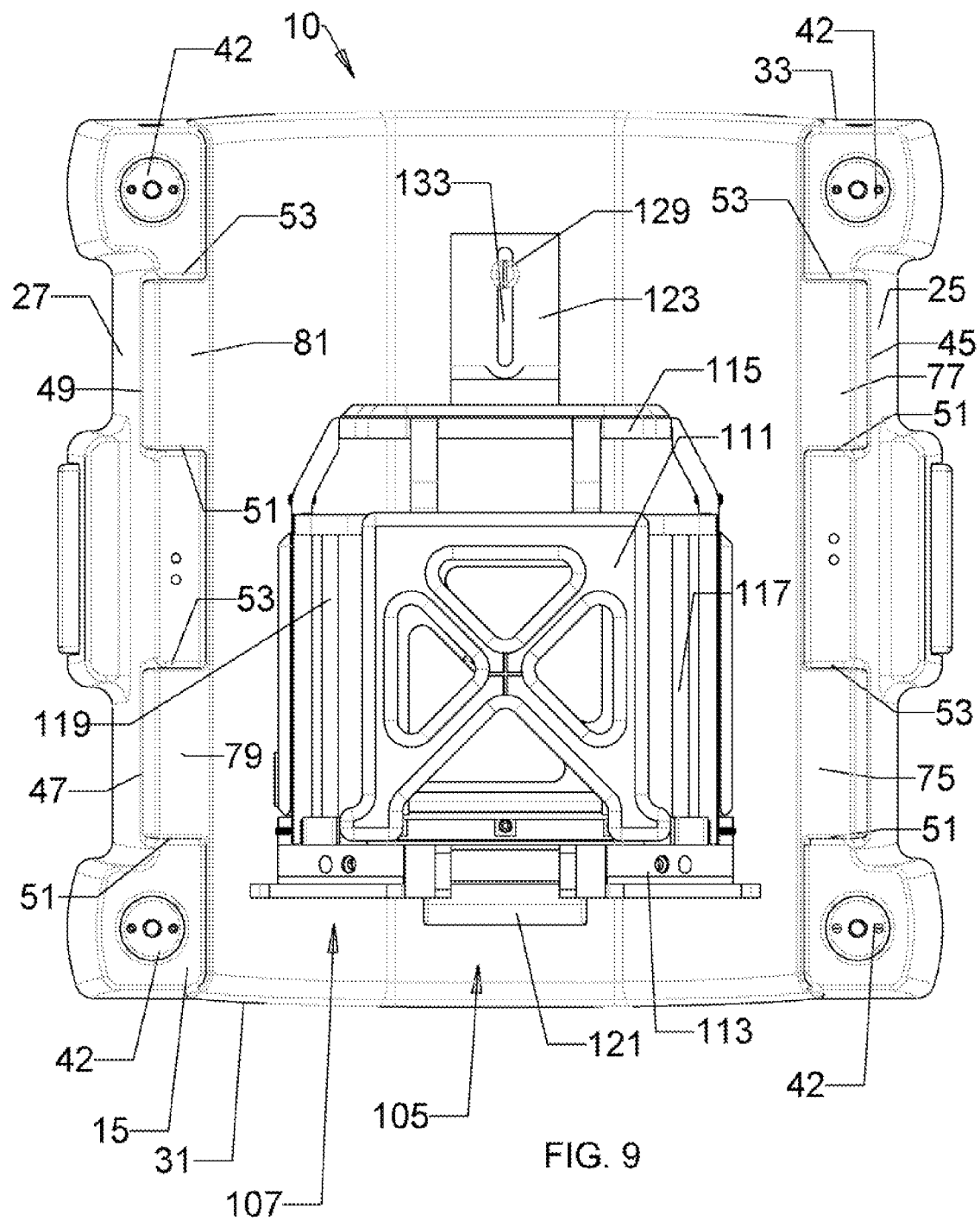
FIG. 9 is a top view of the tray embodiment of FIG. 5.
Figure 14:
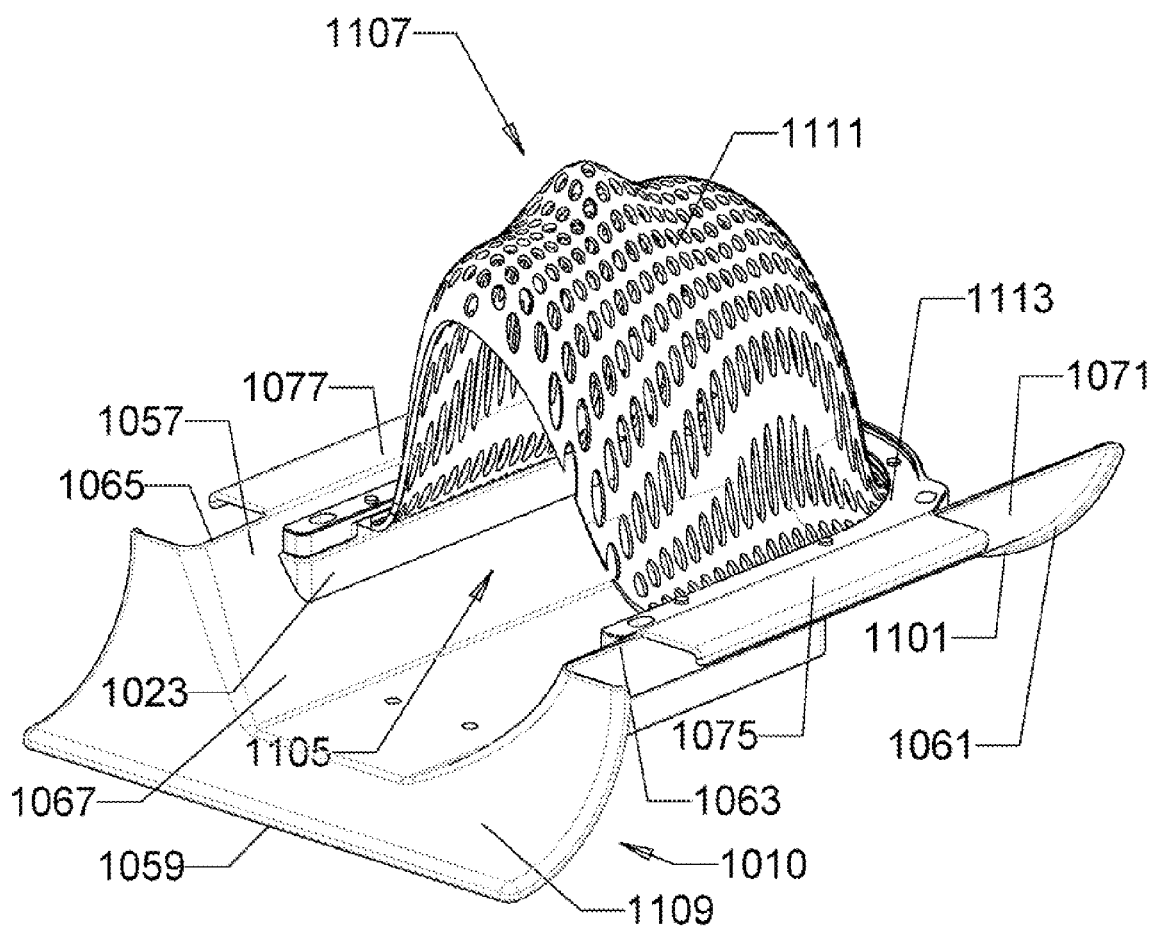
FIG. 14 is a perspective view of the tray embodiment of FIGS. 12-13 and a thermoplastic mask secured thereto.
Figure 15:
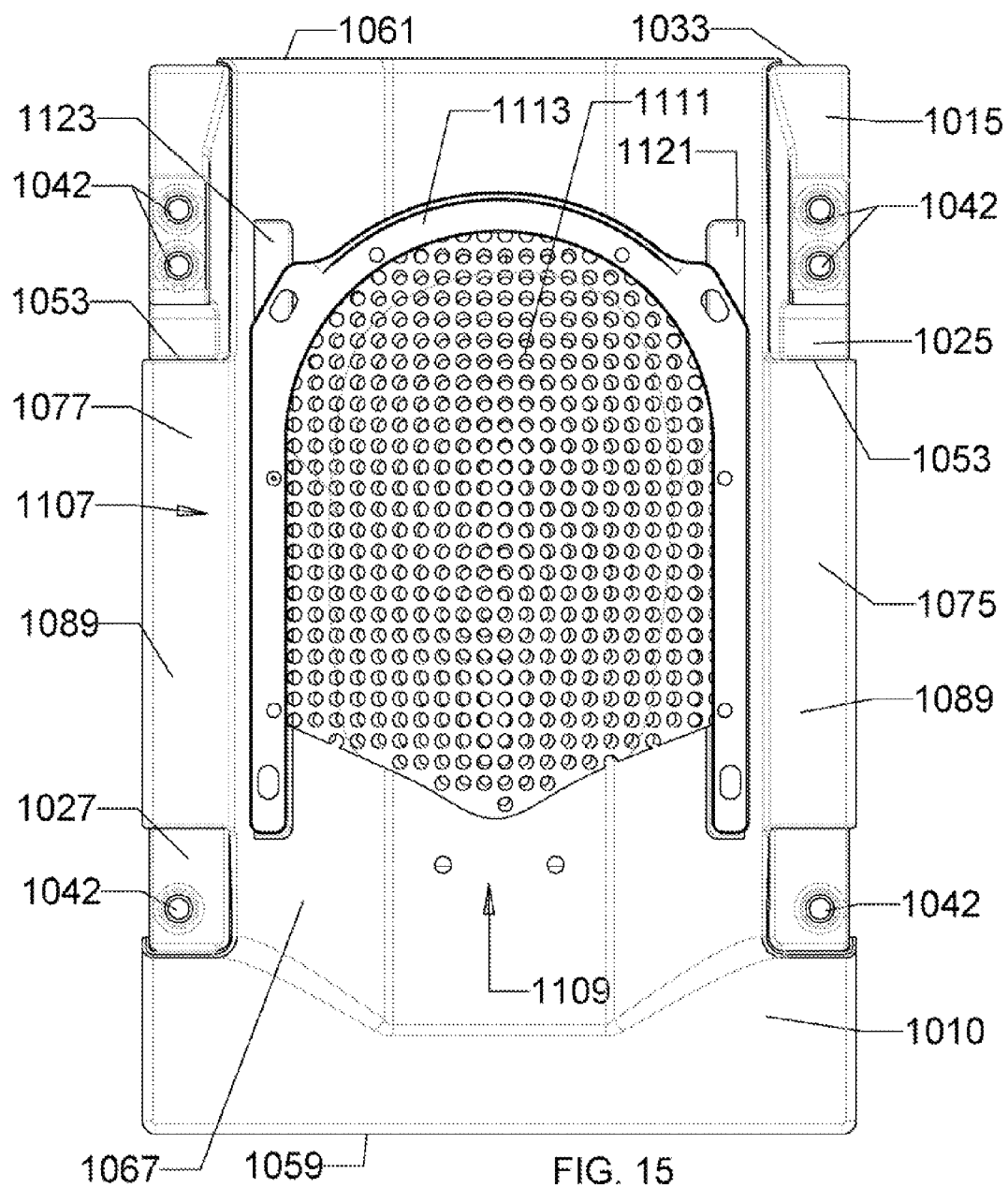
FIG. 15 is a top view of the imaging coil lower housing of FIGS. 11-13, the tray embodiment of FIGS. 12-14 and a thermoplastic mask secured thereto.
Figure 16:
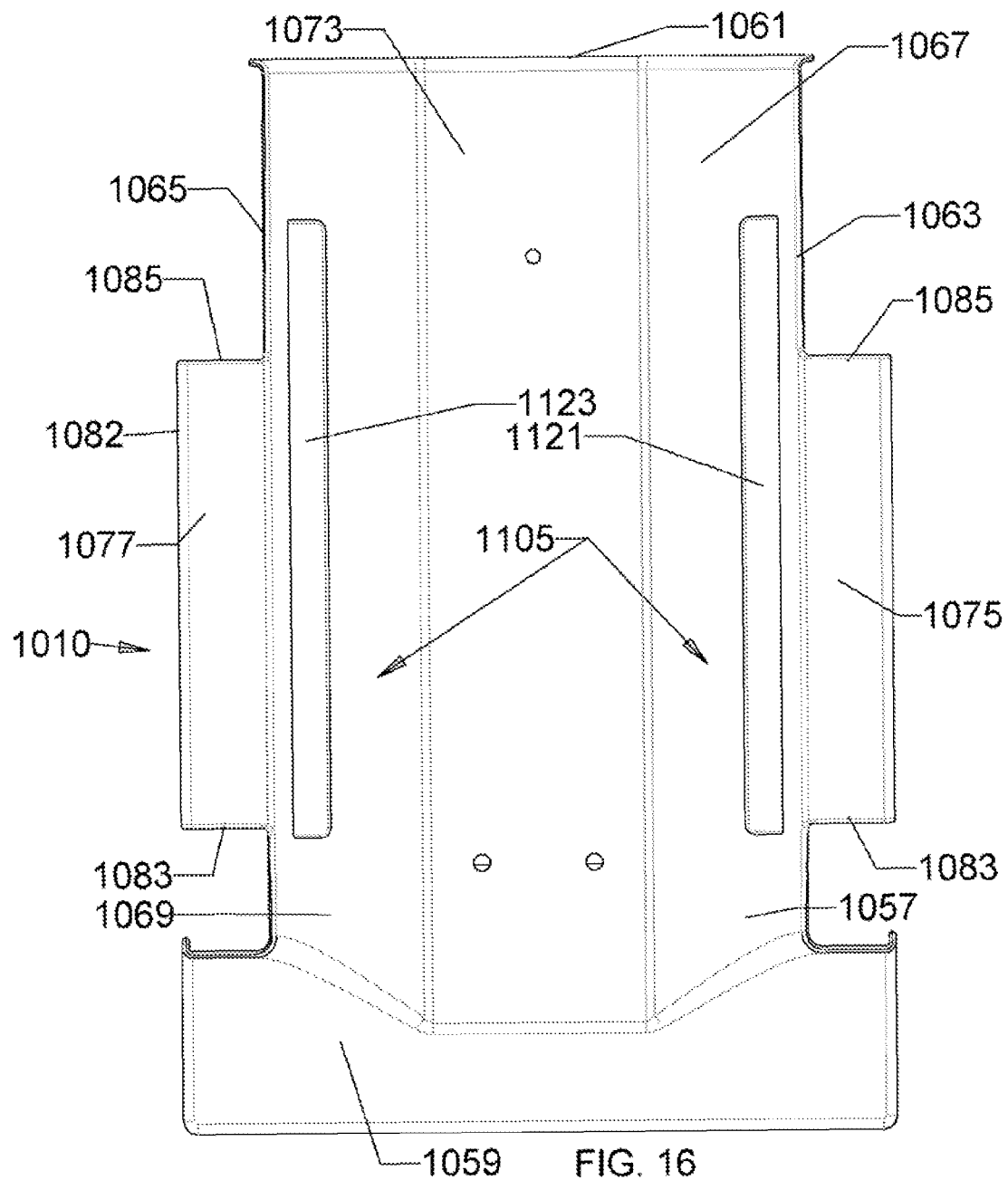
FIG. 16 is a top view of the tray embodiment of FIGS. 12-15.

Before describing exemplary attachment apparatus 105, 1105, it is useful to discuss the structure and use of representative patient-immobilization devices 107, 1107. FIGS. 4 and 9 show an illustrative stereotactic-frame patient-immobilization device 107 and FIGS. 14 and 15 show a thermoplastic mask patient-immobilization device 1107. The stereotactic frame is a rigid helmet-like structure which has a cage-like appearance and is designed to be placed fully around the patient's head for MRI brain or head imaging. The stereotactic frame 107 is fitted over the patient's head via frame opening 109 and the frame 107 is held in a fixed position on the patient's head by means of special screws. Stereotactic frame 107 can be removed from the patient's head and, subsequently, relocated back to the identical position on the patient's head should it be necessary to precisely position the patient's head for further treatment or planning. Stereotactic frame 107 includes rigid side frame elements, of which element 111 is exemplary, and cross elements 113, 115. Elongate fiducial markers 117, 119, which appear in the MRI image and are provided to locate the tissue or thing of interest in the MRI image, are supported by stereotactic frame 107.

Referring next to FIGS. 14 and 15 and thermoplastic mask 1107, a patient's head is inserted into mask 1107 through opening 1109 under mesh mask 1111 mounted to a generally U-shaped base 1113. Contraction and hardening of mesh 1111 (after heating in a water bath) around the patient's face and head, conform's the mesh 1111 to the patient's face profile (FIG. 14) to hold the patient's head in place on tray 1010. Fiducial markers (not shown) can subsequently be affixed to the mask 1107 for the purpose of locating the tissue or thing of interest in the MRI image.

Other types of patient-immobilization devices might include a pillow, a pad, or even hook-and-loop-type fasteners, such as Velcro®.

Attachment apparatus 105, 1105 may be configured to secure stereotactic frame 107, thermoplastic mask 1107 or other types of patient-immobilization and object-holding devices to tray 10, 1010. In the embodiment of FIGS. 2-9, attachment apparatus 105 comprises retainers 121, 123 secured to tray intermediate portion 73. Retainer 121 is secured in fixed position to tray 10 by fasteners 125 (e.g., machine screws) inserted through holes 127 tray 10 and into retainer 121 (FIG. 3). Retainer 123 is secured to tray 10 by fastener 129 (e.g., a machine screw) inserted through hole 131 in tray 10 and into retainer 123 (FIG. 3). Retainer 123 slot 133 enables retainer to be moved, at least, in a back-and-forth movement to position stereotactic frame 107 on tray 10 and to accommodate stereotactic frames 107 of different sizes. Stereotactic frame 107 cross element 113 is held by retainer 121 and cross element 115 is held by retainer 123. Stereotactic frame 107 is clamped tightly in place against tray 10 by retainers 121, 123.

In the embodiment of FIGS. 12-19, attachment apparatus 1105 comprises support elements 1121, 1123. Elements 1121, 1123 are secured to a tray side 1163, 1165 along inner surface 169 by fasteners 1125 (e.g., machine screws) inserted through holes provided in tray 1010. Base 1113 is then secured to support elements 1121, 1123 by suitable fasteners (e.g., machine screws, clips).

Use of exemplary trays 10, 1010 for an exemplary MRI imaging procedure of a patient's head or brain will now be described. It will be understood that other imaging procedures may differ from those described herein. Initially, a medical professional positions the patient's head with respect to tray 10, 1010 outside of imaging coil assembly 11, 1011. In the example using a stereotactic frame patient-immobilization device 107, retainers 121, 123 secure tray 10 to the stereotactic frame 107 already attached to the patient's head. Frame 107 is generally centered on tray 10.

In the example of the thermoplastic mask patient-immobilization device 1107, the tray 1010 and mask 1107 secured thereto are positioned around the patient's head while mesh mask 1111 is warm and soft. Tray 1010 and mask 1107 are comfortably held in fixed position on the patient's head once the mask has cooled. Mask 1111 is generally centered on tray 1010. In both examples, positioning of the patient's head can occur in an open area providing both the medical professional and patient with freedom of movement.

Next, tray 10, 1010 is used to lift the patient's head and to place the patient's head within imaging coil 11, 1011. Protrusions 75-81, 1075-1077 may be utilized to grasp and hold the tray.

In the example of tray 10, protrusions 75-81 are easily seated within recesses 43-49 in lower housing sidewalls 25, 27, thereby positioning tray 10 at its proper position. The close fit between opposed lower housing sidewalls 51-53 and protrusion ends 83, 85 and between each wall 55 and protrusion bottom 87 constrains tray 10 against longitudinal, lateral and rotational movement ensuring that the patient is held still and immobilized at the proper position within the assembled imaging coil 11. Temporary attachment of upper housing 13 to lower housing 15 causes upper housing sidewall surfaces 91 to further constrain any upward movement of tray 10. If provided, front and end protrusions 101, 103 in tray 10 further limit any longitudinal movement of tray 10 with respect to imaging coil 11. Further constraint against tray movement is provided by coaction of tray front and rear end protrusions 99, 101 with lower housing front and rear ends 1031, 1033.

In the example of tray 1010, tray 1010 and the patient's head secured thereto are lowered into lower housing 1015 with protrusions 1075, 1075 resting on surfaces 1055 of lower housing sidewalls 1025, 1027. Temporary attachment of upper housing 1013 to lower housing 1015 causes facing sidewalls 1051, 1053 and surface 1055 partially defining respective openings 1047, 1049 to abut respective protrusion 1075, 1077 surfaces 1083-1087. The close fit of protrusions 1075, 1077 with imaging coil 1011 constrains tray 1010 against longitudinal, lateral and rotational movement ensuring once again that the patient is properly positioned and held still within imaging coil 1011. Further constraint against tray movement is provided by coaction of protrusion 1095 with recess 1056, by contact between edges 1093 and sidewalls 1025, 1027 and by tray front and rear end protrusions 1099, 1101 with lower housing front and rear ends 1031, 1033.

Once positioned, the patient and imaging coil assembly 11, 1011 can be moved into the tunnel of an MRI imaging machine for MRI imaging. After imaging and opening of MRI coil assembly 11, 1011, the protrusions 75-81 and 1075-1077 can be grasped and the tray 10, 1010 to which the patient is secured can be easily lifted from lower housing 15, 1015. Tray 10, 1010 supports the patient's body for movement to a position in which the patient can be separated from the patient-immobilization device 107, 1107.

While the principles of this invention have been described in connection with specific embodiments, it should be understood clearly that these descriptions are made only by way of example and are not intended to limit the scope of the invention.

The invention claimed is:

1. A tray for positioning an object temporarily within an imaging coil comprising:

a body having ends, sides and an object-supporting wall between the sides, the body being sized to fit within an imaging coil lower housing between lower housing sidewalls and across a lower housing surface between the sidewalls; and at least one protrusion extending laterally outward from each side of the body to a distal edge, each protrusion further having ends and a bottom the ends being positioned and arranged to fit closely between corresponding opposed surfaces on the imaging coil and the bottom being positioned and arranged to at least partially contact a corresponding lower housing sidewall surface such that contact between the protrusions and corresponding imaging coil surfaces locates the tray at a position within the imaging coil and constrains tray movement.

2. The tray of claim 1 wherein each body side has an upper end and each protrusion extends laterally outward from an upper end.

3. The tray of claim 1 wherein each protrusion end is generally planar.

4. The tray of claim 1 wherein contact between the protrusion ends and the corresponding opposed imaging coil surfaces constrains tray longitudinal movement.

5. The tray of claim 1 wherein contact between each protrusion bottom and the corresponding imaging coil lower housing sidewall surface constrains tray rotational movement.

6. The tray of claim 5 wherein each protrusion distal edge includes a downwardly-depending edge portion which abuts a lower housing sidewall such that contact between the edge and the lower housing sidewall further constrains tray movement.

7. The tray of claim 1 wherein each protrusion further has a top surface positioned and arranged to contact a corresponding upper housing sidewall such that joining together of the upper and lower housings along their sidewalls forms the imaging coil and clamps the protrusions between the sidewalls to constrain tray movement.

8. The tray of claim 1 further comprising two protrusions extending laterally outward from each side of the body.

9. The tray of claim 1 wherein each protrusion provides a gripping surface.

10. The tray of claim 1 wherein each protrusion has a color which differs from a color of the imaging coil and the color difference facilitates locating of the protrusions with respect to the corresponding imaging coil surfaces.

11. The tray of claim 1 wherein the body has a generally concave inner surface and a generally convex outer surface.

12. The tray of claim 11 further comprising attachment apparatus for securing a patient-immobilization device to the inner surface.

13. The tray of claim 12 wherein the attachment apparatus comprises first and second retainers secured to the inner surface.

14. The tray of claim 11 wherein at least portions of the generally convex outer surface are positioned and arranged to rest on the lower housing surface when the tray is within the imaging coil.

15. The tray of claim 11 further comprising surfaces along the tray outer surface positioned and arranged to contact corresponding surfaces along the lower housing surface such that contact between the surfaces constrains tray movement.

16. The tray of claim 1 wherein the tray is a unitary part.

17. The tray of claim 1 wherein the tray is made of a material selected from the group consisting of plastics and non-magnetic metals.

18. The tray of claim 17 wherein the plastic material is selected from the group consisting of polycarbonate, nylon, polyurethane, polyoxymethylene, ultra high molecular weight polyethylene, and high performance polyethylene.

19. A tray for temporarily positioning an object at a position within an imaging coil comprised of separable upper and lower housings, the tray comprising:

a unitary body having sides, ends and a generally concave wall between the sides, the body being sized to fit in the lower housing between lower housing sidewalls and across a generally concave lower housing surface between the sidewalls; and at least one protrusion extending laterally outward from each body side, each protrusion being integral with the unitary body and having a distal edge, opposed ends, and a bottom, the ends being positioned and arranged to fit closely between opposed imaging coil walls and the bottom being positioned and arranged to at least partially contact an upper surface of a respective lower housing sidewall to locate the tray at the position and provide constraint against tray movement.

20. A tray for temporarily positioning an object at a position within an imaging coil, the tray comprising:

a body having sides, ends and a generally concave wall between the sides, the body being sized to fit between lower housing sidewalls and across a generally concave lower housing surface between the sidewalls; and at least one protrusion extending laterally outward from each body side, each protrusion having a distal edge, opposed ends, and a bottom, the ends being positioned and arranged to fit closely between opposed imaging coil walls and the bottom being positioned and arranged to at least partially contact a respective lower housing sidewall to locate the tray at the position and limit tray movement.

* * * * *